United States Patent
Tsuchi

(12) 
(10) Patent No.: US 6,661,259 B2
(45) Date of Patent: Dec. 9, 2003

(54) DRIVER CIRCUIT

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/188,866

(22) Filed: Jul. 5, 2002

(65) Prior Publication Data

US 2003/0011408 A1 Jan. 16, 2003

(30) Foreign Application Priority Data

Jul. 6, 2001 (JP) .................................. 2001-206986

(51) Int. Cl.[7] .............................. H03B 1/00; H03K 3/00
(52) U.S. Cl. ..................... 327/108; 327/111; 327/112
(58) Field of Search ............................ 327/111, 112, 327/108; 326/82, 83, 86, 87, 92; 345/98

(56) References Cited

U.S. PATENT DOCUMENTS

| | | | |
|---|---|---|---|
| 5,694,060 A | * 12/1997 | Brunt et al. | 326/86 |
| 5,731,711 A | * 3/1998 | Gabara | 326/30 |
| 5,982,207 A | * 11/1999 | Wilcox | 327/112 |
| 6,037,811 A | * 3/2000 | Ozguc | 327/108 |
| 6,320,433 B1 | * 11/2001 | Hinterscher | 327/112 |

FOREIGN PATENT DOCUMENTS

| | | |
|---|---|---|
| JP | 11-119750 | 4/1999 |
| JP | 2000-338461 | 12/2000 |

* cited by examiner

*Primary Examiner*—Tuan T. Lam
(74) *Attorney, Agent, or Firm*—McGinn & Gibb, PLLC

(57) ABSTRACT

A driver circuit includes a follower transistor and a first switch connected serially between an output terminal and a first power supply, a first current source and a second switch connected serially between the output terminal and a second power supply, and a bias control device for supplying the follower transistor with an input bias voltage based upon an input signal voltage. The first switch is turned on at one timing in a data output interval, thereby causing the transistor to perform a follower operation to drive the output terminal voltage to the vicinity of a certain voltage defined in conformity with the input signal voltage, the second switch is turned on at a timing subsequent to the one timing, thereby placing both the first and second switches in the ON state, and the output terminal voltage is driven to the certain voltage, which is defined in conformity with the input signal voltage, from the subsequent timing onward.

34 Claims, 17 Drawing Sheets

FIG. 2

| INPUT VOLTAGE LEVEL / TIMING | ONE DATA OUTPUT INTERVAL LOW POTENTIAL LEVEL | | | | ONE DATA OUTPUT INTERVAL HIGH POTENTIAL LEVEL | | | |
|---|---|---|---|---|---|---|---|---|
| | t0~t1 | t1~t2 | t2~t3 | | t0'~t1' | t1'~t2' | t2'~t3' | |
| PRELIMINARY CHARGING/DISCHARGING MEANS 13 | PRE-DISCHARGE | HALT | HALT | | PRECHARGE | HALT | HALT | |
| SWITCH 131 | OFF | ON | ON | | OFF | OFF | OFF | |
| SWITCH 132 | OFF | OFF | ON | | OFF | OFF | OFF | |
| SWITCH 141 | OFF | OFF | OFF | | OFF | ON | ON | |
| SWITCH 142 | OFF | OFF | OFF | | OFF | OFF | ON | |

FIG. 4A

| | ONE DATA OUTPUT INTERVAL | | | |
|---|---|---|---|---|
| INPUT VOLTAGE LEVEL | LOW POTENTIAL LEVEL | | | |
| TIMING | t0~t1 | t1~t2 | t2~t3 | t3~t4 |
| PRELIMINARY CHARGING/ DISCHARGING MEANS 13 | PRE-DISCHARGE | PRE-DISCHARGE | HALT | HALT |
| SWITCH 131 | OFF | OFF | ON | ON |
| SWITCH 132 | OFF | OFF | OFF | ON |
| SWITCH 133 | OFF | ON | ON | ON |
| SWITCH 134, 135 | OFF | OFF | OFF | ON |
| SWITCH 136 | ON | OFF | OFF | OFF |
| SWITCHES 141 TO 146 | OFF | OFF | OFF | OFF |

FIG. 4B

| | ONE DATA OUTPUT INTERVAL | | | |
|---|---|---|---|---|
| INPUT VOLTAGE LEVEL | HIGH POTENTIAL LEVEL | | | |
| TIMING | t0'~t1' | t1'~t2' | t2'~t3' | t3'~t4' |
| PRELIMINARY CHARGING/ DISCHARGING MEANS 13 | PRECHARGE | PRECHARGE | HALT | HALT |
| SWITCH 141 | OFF | OFF | ON | ON |
| SWITCH 142 | OFF | OFF | OFF | ON |
| SWITCH 143 | OFF | ON | ON | ON |
| SWITCH 144, 145 | OFF | OFF | OFF | ON |
| SWITCH 146 | ON | OFF | OFF | OFF |
| SWITCHES 131 TO 136 | OFF | OFF | OFF | OFF |

| | ONE DATA OUTPUT INTERVAL | ONE DATA OUTPUT INTERVAL |
|---|---|---|
| SWITCH 136 | ON / OFF | OFF |
| SWITCH 133 | OFF / ON / OFF | OFF |
| SWITCH 201 | ON / OFF | OFF |
| SWITCH 131 | OFF / ON | OFF |
| SWITCH 132, 134, 135 | OFF / ON | OFF |
| SWITCH 146 | OFF | ON / OFF |
| SWITCH 143 | OFF | OFF / ON |
| SWITCH 202 | OFF | ON / OFF |
| SWITCH 141 | OFF | OFF / ON |
| SWITCH 142, 144, 145 | OFF | OFF / ON |
| SWITCH 155, 156 | OFF / ON | OFF / ON | t0　t1　t2　t3　t4
　　　　　　　t0'　t1'　t2'　　t3'　t4'

FIG. 9B VOLTAGE

CONDITIONS : VDD=5V、VSS=0V、Vin=2.5V、OUTPUT LOAD : 1kΩ、15pF

DRIVER CIRCUIT

FIELD OF THE INVENTION

This invention relates to a driver circuit and, more particularly, to a driver circuit suited for driving a capacitive load.

BACKGROUND OF THE INVENTION

For technical publications related to the present invention, see (1) the specification of Japanese Patent Kokai Publication JP-A-11-119750, and (2) the specification of Japanese Patent Kokai Publication JP-A-2000-338461.

FIG. 13 is a diagram illustrating one example of the structure of a driver circuit in a liquid crystal display device disclosed in the specification of Japanese Patent Kokai Publication JP-A-11-119750. As shown in FIG. 13, the driver circuit includes an N-channel MOS transistor 1011 whose source is connected to an input terminal T1 via a switch 1031 and whose gate and drain are tied together; a switch 1032 connected between the drain of the N-channel MOS transistor 1011 and a high-potential power supply VDD; an N-channel MOS transistor 1012 whose gate is connected in common with the gate of the N-channel MOS transistor 1011 (where the node at the point of connection is represented by V10) and whose drain is connected to the high-potential power supply VDD via a switch 1033; a P-channel MOS transistor 1021 whose source is connected to the input terminal T1 via a switch 1041 and whose gate and drain are tied together; a switch 1042 connected between the drain of the P-channel MOS transistor 1021 and the low-potential power supply VSS; and a P-channel MOS transistor 1022 whose gate is connected in common with the gate of the P-channel MOS transistor 1021 (where the node at the point of connection is represented by V20) and whose drain is connected to a low-potential power supply VSS via a switch 1043. The source of the N-channel MOS transistor 1012 and the source of the P-channel MOS transistor 1022 are connected in common and to an output terminal T2. The driver circuit further includes preliminary charging/discharging means constituted by a switch 1044 connected between the output terminal T2 and the high-potential power supply VDD and a switch 1034 connected between the output terminal T2 and the low-potential power supply VSS.

FIG. 14A is a timing chart illustrating the operation for controlling the switches in the conventional driver circuit of FIG. 13, and FIG. 14B is a diagram illustrating the voltage waveforms of the internal nodes V10, V20 and output voltage Vout of the conventional driver circuit of FIG. 13.

The operation for controlling the switches of the conventional driver circuit will be described with reference to FIG. 13 and FIGS. 14A, 14B.

First, at time t0, the switches 1032 and 1034 are turned on to establish a precharging mode, as a result of which the output voltage Vout declines. Since the switches 1031 and 1032 are off and on, respectively, under these conditions, the bias voltage at the gates of the transistors 1011 and 1012 is the power supply voltage VDD.

Next, at time t1, the switches 1031 and 1032 are turned on and off, respectively. As a result, owing to the action of the transistor 1011, the bias voltage changes to a voltage shifted from an input voltage Vin by an amount equivalent to a threshold value Vth1011 of the transistor 1011. Specifically, the bias voltage V10 is represented by the following equation:

$$V10 = Vin + Vth1011$$

It should be noted that the threshold value Vth of the transistor is represented by a potential for which the source is the reference.

Next, at time t2, the switch 1034 is turned off, the precharging mode ends and the switch 1033 is turned on. Under these conditions, the transistor 1012 acts as a source follower and therefore the output voltage Vout changes to a voltage shifted from the bias voltage V10 at the gate of the transistor 1012 by an amount equivalent to a threshold value Vth1012 of the N-channel MOS transistor 1012. Specifically, the output voltage Vout is represented by the following equation:

$$Vout = V10 - Vth1012$$
$$= Vin + Vth1011 - Vth1012$$

If Vth1011≈Vth1012 holds, then Vout≈Vin will hold and the output voltage Vout will become approximately equal to the input voltage Vin.

At time t0' (=t3), the switches 1042 and 1044 are turned on to establish the precharging mode, as a result of which the output voltage Vout rises. Since the switches 1041 and 1042 are off and on, respectively, under these conditions, the bias voltage at the gates of the transistors 1021, 1022 is the power supply voltage VSS.

Next, at time t1', the switches 1041 and 1042 are turned on and off, respectively. As a result, owing to the action of the transistor 1021, the bias voltage changes to a voltage shifted from the input voltage Vin by an amount equivalent to a threshold value Vth1021 of the transistor 1021. Specifically, the bias voltage V20 is represented by the following equation:

$$V20 = Vin + Vth1021$$

Next, at time t2', the switches 1044 and 1043 are turned off and on, respectively, and the precharging mode ends. Under these conditions, the transistor 1022 acts as a source follower and therefore the output voltage Vout changes to a voltage shifted from the bias voltage V20 at the gate of the transistor 1022 by an amount equivalent to a threshold value Vth1022 of the transistor 1022. Specifically, the output voltage Vout is represented by the following equation:

$$Vout = V20 - Vth1022$$
$$= Vin + Vth1021 - Vth1022$$

If Vth1021≈Vth1022 holds with regard to the threshold voltages of the P-channel MOS transistors 1021 and 1022, then Vout≈Vin will hold and the output voltage Vout will become approximately equal to the input voltage Vin. It should be noted that in the case of an actual process for manufacturing a LSI chip, there are instances where the threshold voltage of a MOS transistor exhibits some variation. However, by forming the transistors 1011, 1012, 1021, 1022 close to one another and in the same size in the integrated circuit, $$Vth1011 \approx Vth1012, Vth1021 \approx Vth1022$$

can be realized with comparative ease. Thus, the output voltage Vout can be made equal to the input voltage Vin and a data line DL can be driven with a high current supply capability owing to the source-follower action of the transistors.

This driver circuit is such that the transistors 1012 and 1022 function as source followers and little power is consumed because current other than that necessary for charging and discharging does not flow. However, it is difficult to drive the output voltage Vout to a voltage equal to the input voltage Vin rapidly. The reason for this is that in a transistor source-follower operation, most actual transistors have such a characteristic that the current driving capability varies gently while gradually decreasing when the gate-source voltage approaches the threshold voltage, as a result of which an extended period of time is required for the gate-source voltage to reach the vicinity of the threshold voltage and stabilize in the source-follower operation.

FIG. 15 is a diagram illustrating a driver circuit described in the specification of Japanese Patent Kokai Publication JP-A-2000-338461 (see FIG. 9 in the same specification). By controlling current in a source-follower driver circuit, it is possible to achieve rapid drive and produce a highly precise voltage output.

As shown in FIG. 15, this conventional driver circuit includes the N-channel MOS transistor 1011 whose source is connected to the input terminal T1 via the switch 1031 and whose gate and drain are tied together; a current source 1013 (current I11) connected between the drain of the N-channel MOS transistor 1011 and the high-potential power supply VDD; the N-channel MOS transistor 1012 whose gate is connected in common with the gate of the N-channel MOS transistor 1011 and whose drain is connected to the high-potential power supply VDD via the switch 1033; the switch 1032 connected between the common gates of the N-channel MOS transistors 1011 and 1012 and the high-potential power supply VDD; the P-channel MOS transistor 1021 whose source is connected to the input terminal T1 via the switch 1041 and whose gate and drain are tied together; a current source 1023 (current I21) connected between the drain of the P-channel MOS transistor 1021 and the low-potential power supply VSS; and the P-channel MOS transistor 1022 whose gate is connected in common with the gate of the P-channel MOS transistor 1021 and whose drain is connected to the low-potential power supply VSS via the switch 1043. The common gates of the P-channel MOS transistors 1021 and 1022 are connected to the low-potential power supply VSS via the switch 1042, the sources of the N-channel MOS transistor 1012 and P-channel MOS transistor 1022 are connected in common and to the output terminal T2. The driver circuit further includes preliminary charging/discharging means constituted by the switch 1044 connected between the output terminal T2 and the high-potential power supply VDD and the switch 1034 connected between the output terminal T2 and the low-potential power supply VSS. The driver circuit further includes a switch 1046 and a current source 1025 (current I23) between the output terminal T2 and the high-potential power supply VDD, a switch 1036 and a current source 1015 (current I13) between the output terminal T2 and the low-potential power supply VSS, a switch 1045 and a current source 1024 (current I22) between the input terminal T1 and the high-potential power supply VDD, and a switch 1035 and a current source 1014 (current I12) between the input terminal T1 and the low-potential power supply VSS. It is assumed that a capacitive load (not shown) has been connected to the output terminal T2.

The operation of the driver circuit shown in FIG. 15 will be described with reference to FIGS. 16A and 16B. FIG. 16A illustrates two output intervals, namely one output interval (times t0 to t3) in which a voltage of any level below voltage Vm is output, and a one output interval (times t0' to t3') in which a voltage of any level equal to or greater than voltage Vm is output. FIG. 16B is a voltage waveform diagram for a case where currents I11, I13, I21 and I23 are controlled so as to render equal the gate-source voltages Vgs1011(I11) and Vgs1012(I13) of the transistors 1011, 1012 as well as the gate-source voltages Vgs1021(I21) and Vgs1022(I23) of the transistors 1021 and 1022, thereby producing an output voltage Vout that is equal to the input voltage Vin. It should be noted that Vgs1011(I11) is a gate voltage (gate-source voltage) with respect to the source when the drain current of the transistor 1011 is I11.

At time t0 in FIG. 16, the switches 1032 and 1034 are turned on and all of the switches 1042, 1044, 1041, 1045, 1043 and 1046 are turned off. The node V10 is precharged to the voltage VDD via the switch 1032. At time t1, the switch 1032 is turned off and the switches 1031, 1035 are turned on, from which point the voltage V10 changes to a voltage shifted from the input voltage Vin by an amount equivalent to the gate-source voltage Vgs1011(I11) of the transistor 1011. The voltage V10 stabilizes at $$V10 = Vin + Vgs1011(I11)$$

The output voltage Vout is discharged to the voltage VSS if the switch 1034 is turned on at time t0. If the switch 1034 is turned off and the switches 1033 and 1036 are turned on at time t2, then, from time t2 onward, the output voltage Vout changes to a voltage shifted from the input voltage Vin by an amount equivalent to the gate-source voltage Vgs1012(I13) of the transistor 1012 owing to the source-follower operation of the transistor 1012. The voltage Vout stabilizes at $$Vout = V10 - Vgs1012(I13)$$

If Vgs1011(I11) and Vgs1012(I13) are positive values and the currents I11 and I13 are controlled so as to make these two voltages equal, then the output voltage Vout will become equal to the input voltage Vin. Further, the output-voltage range becomes $$VSS \leq Vout \leq VDD - Vgs1012(I13)$$

In the interval t0' to t3', the switches 1042 and 1044 are turned on and the switches 1032, 1034, 1031, 1035, 1033 and 1036 are all turned off at time t0'. The voltage V20 is discharged to the voltage VSS via the switch 1042. At time t1', the switch 1042 is turned off and the switches 1041 and 1045 are turned on, from which point the voltage V20 changes to a voltage shifted from the input voltage Vin by an amount equivalent to the gate-source voltage Vgs1021 (I21) (<0) of the transistor 1021. The voltage V20 stabilizes at $$V20 = Vin + Vgs1021(I21)$$

The output voltage Vout is precharged to the voltage VDD if the switch 1044 is turned on at time t0'. If the switch 1044 is turned off and the switches 1043 and 1046 are turned on at time t2', then, from time t2' onward, the output voltage Vout changes to a voltage shifted from the voltage V20 by an amount equivalent to the gate-source voltage Vgs1022 (I23) (<0) of the transistor 1022 owing to the source-follower operation of the transistor 1022. The voltage Vout stabilizes at $$Vout = V20 - Vgs1022(I23)$$

$$= Vin + Vgs1021(I21) - Vgs1022(I23)$$

If Vgs1021(I21) and Vgs1022(I23) are negative values and the currents I21 and I23 are controlled so as to make these two voltages equal, then the output voltage Vout will become equal to the input voltage Vin. Further, the output-voltage range becomes $$VSS - Vgs1022(I23) \leq Vout \leq VDD$$

With the arrangement shown in FIG. 15, the switches 1031 and 1035 are ON from times t1 to t3, the switches 1033 and 1036 are on from times t2 to t3, the switches 1041 and 1045 are on from times t1' to t3' and the switches 1043 and 1046 are on from timings t2' to t3'. As a result, an operation maintaining current is passed substantially steadily and static power consumption occurs. The Inventor has found that there is room for improvement in this regard.

FIG. 17 is a diagram illustrating a driver circuit described in the specification of Japanese Patent Kokai Publication JP-A-2000-338461 (see FIG. 12 in the same specification). The number of elements and the number of switching control signals are reduced over those of the arrangement shown in FIG. 15.

As shown in FIG. 17, this driver circuit is one in which the current control circuits 1014 and 1024 and the switches 1035 and 1045 have been eliminated from the arrangement of the driver circuit illustrated in FIG. 15 and to which a P-channel MOS transistor 1016 and an N-channel MOS transistor 1026 have been added anew. The P-channel MOS transistor 1016 has its source and drain connected to the gate (drain) and source, respectively, of the N-channel MOS transistor 1011, and has a voltage BIASP applied to its gate. The N-channel MOS transistor 1026 has its source and drain connected to the gate (drain) and source, respectively, of the P-channel MOS transistor 1021, and has a voltage BIASN applied to its gate. The voltage BIASP is supplied also to the gates of the P-channel MOS transistors 1013, 1025, and the voltage BIASN is supplied also to the gates of the N-channel MOS transistors 1015, 1023. The P-channel MOS transistor 1016 is made a transistor having a threshold voltage lower than that of the P-channel MOS transistor 1013 and a current supply capability sufficiently greater than that of the P-channel MOS transistor 1013 with respect to the same gate voltage. The N-channel MOS transistor 1026 also is made a transistor having a threshold voltage lower than that of the N-channel MOS transistor 1023 and a current supply capability sufficiently greater than that of the N-channel MOS transistor 1023 with respect to the same gate voltage. The circuit block consisting of the N-channel MOS transistor 1011 and P-channel MOS transistors 1013 and 1016 is represented by a circuit block 1010, and the circuit block consisting of the P-channel MOS transistor 1021 and N-channel MOS transistors 1023 and 1026 is represented by a circuit block 1020. The P-channel MOS transistor 1016 turns on when the input voltage Vin is in the vicinity of the power supply voltage VDD and the N-channel MOS transistor 1011 is about to turn off, and hence the transistor 1016 functions in such a manner that the current controlled by the current source 1013 flowing between the input terminal T1 and power supply VDD will not be cut off. Further, the N-channel MOS transistor 1026 turns on when the input voltage Vin is in the vicinity of the power supply voltage VSS and the N-channel MOS transistor 1021 is about to turn off, and hence the transistor 1026 functions in such a manner that the current controlled by the current source 1023 flowing between the input terminal T1 and power supply VSS will not be cut off. Accordingly, in the interval t0 to t3 in FIG. 16, the circuit block 1020 and switch 1041 can operate in a manner similar to that of the current source 1014 and switch 1035 in FIG. 15. In the interval t0' to t3' in FIG. 16, the circuit block 1010 and switch 1031 can operate in a manner similar to that of the current source 1024 and switch 1045 in FIG. 15. As a result, the circuit of FIG. 17 can perform drive in a manner similar to the voltage waveforms shown in FIG. 16A.

As with the driver circuit shown in FIG. 15, an operation maintaining current is passed substantially steadily and static power consumption occurs in the circuit illustrated in FIG. 17. The Inventor has found that there is room for improvement in this regard.

SUMMARY OF THE DISCLOSURE

Accordingly, it is an object of the present invention to provide a driver circuit that performs a follower operation, in which it is possible to produce a highly precise output while reducing power consumption, as well as a liquid crystal display device having this driver circuit.

In accordance with a first aspect of the present invention, the foregoing object is attained by providing a driver circuit comprising a follower transistor arranged between an output terminal and a first power supply; a first control means for controlling activation and deactivation of the transistor; a current source arranged between the output terminal and a second power supply; a second control means for controlling activation and deactivation of the current source; and bias control means for supplying the transistor with an input bias voltage based upon an input signal voltage; wherein control is made such that said transistor is activated while said current source is deactivated at one timing in a data output interval, thereby causing said transistor to perform a follower operation, and then from a timing subsequent to the said one timing onward, both said transistor and said current source are activated to cause the output terminal voltage to be driven to a certain voltage, which is defined in conformity with the input signal voltage.

A driver circuit in accordance with another aspect of the present invention, comprises a follower transistor and a first switch connected serially between an output terminal and a first power supply; a first current source and a second switch connected serially between the output terminal and a second power supply; and bias control means for supplying the follower transistor with an input bias voltage based upon an input signal voltage; wherein the first switch is turned on at one timing in a data output interval, thereby causing the transistor to perform a follower operation to drive the output terminal voltage to the vicinity of a certain voltage defined in conformity with the input signal voltage; the second switch is turned on at a timing subsequent to the one timing, thereby placing both the first and second switches in the ON state; and the output terminal voltage is driven to the certain voltage, which is defined in conformity with the input signal voltage, from the subsequent timing onward.

In accordance with a further aspect of the present invention, the foregoing object is attained by providing a driver circuit comprising a source-follower first MOS transistor of first conductivity type and a first switch connected serially between an output terminal and a high-potential power supply; a first current source and a second switch connected serially between the output terminal and a low-potential power supply; first gate bias control means for supplying the first MOS transistor with a gate bias voltage based upon an input signal voltage; and means for turning on the first switch at one timing in a data output interval, thereby causing the first MOS transistor to perform a source-follower operation to drive the output terminal voltage to the vicinity of a certain voltage defined in conformity with the input signal voltage, and turning on the second switch at a timing subsequent to the one timing, thereby placing both the first and second switches in the ON state; wherein the output terminal voltage is driven to the certain voltage, which is defined in conformity with the input signal voltage, from the subsequent timing onward, which is for controlling drain current of the first MOS transistor.

Further, a driver circuit according to the present invention comprises a source-follower second MOS transistor of second conductivity type and a third switch connected serially between an output terminal and a low-potential power supply; a second current source and a fourth switch connected serially between the output terminal and a high-potential power supply; second gate bias control means for supplying the second MOS transistor with a gate bias voltage based upon an input signal voltage; and means for turning on the third switch at one timing in a data output interval, thereby causing the second MOS transistor to perform a source-follower operation to drive the output terminal voltage to the vicinity of a certain voltage defined in conformity with the input signal voltage, and turning on the fourth switch at a timing subsequent to the one timing, thereby placing both the third and fourth switches in the ON state; wherein the output terminal voltage is driven to the certain voltage, which is defined in conformity with the input signal voltage, from the subsequent timing onward, which is for controlling drain current of the second MOS transistor.

In the present invention, the first gate bias control means includes a third MOS transistor of first conductivity type having a drain and gate connected in common with a gate of the first MOS transistor and a source connected to the input terminal via a fifth switch; a third current source and a sixth switch connected serially between the drain of the third MOS transistor and the high-potential power supply; a fourth current source and a seventh switch connected serially between a connection node of the input terminal and fifth switch and the low-potential power supply; and an eighth switch connected between a common connection node of the gates of the first and third MOS transistors and the high-potential power supply.

In the present invention, the second gate bias control means includes a fourth MOS transistor of second conductivity type having a drain and gate connected in common with a gate of the second MOS transistor and a source connected to the input terminal via a ninth switch; a fifth current source and a tenth switch connected serially between the drain of the fourth MOS transistor and the low-potential power supply; a sixth current source and an 11th switch connected serially between a connection node of the input terminal and ninth switch and the high-potential power supply; and a 12th switch connected between a common connection node of the gates of the second and fourth MOS transistors and the low-potential power supply.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a diagram useful in describing the operation of the embodiment shown in FIG. 1;

FIGS. 4A and 4B are diagrams useful in describing the operation of the embodiment shown in FIG. 3;

FIG. 9B is a waveform diagram illustrating voltage waveforms of an internal node, input signal voltage and output voltage;

PREFERRED EMBODIMENTS OF THE INVENTION

Preferred embodiments of the present invention will be described below.

Figure 1:
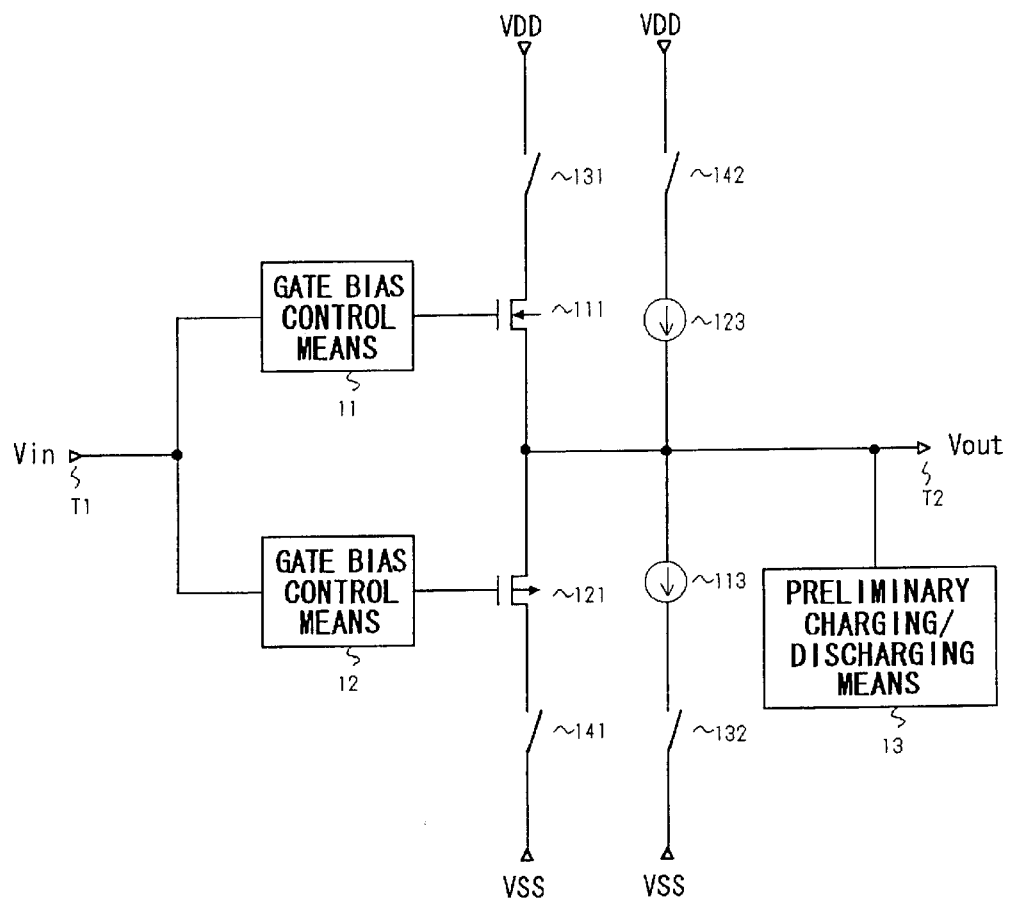
FIG. 1 is a diagram illustrating the structure of an embodiment of the present invention.

FIG. 1 is a diagram illustrating the basic structure of a driver circuit according to an embodiment of the present invention.

As shown in FIG. 1, the driver circuit comprises: a follower transistor (111) and a switch (131) connected serially between an output terminal (T2) and a power supply (VDD); a current source (113) and a switch (132) connected serially between the output terminal (T2) and a power supply (VSS); and bias control means (11) for supplying the transistor (111) with a bias voltage based upon an input signal voltage. The switch (131) is turned on at one timing in a data output interval, thereby causing the transistor (111) to perform a follower operation to drive output terminal voltage Vout to the vicinity of a certain voltage defined in conformity with input signal voltage Vin. The switch (132) is turned on (switch 131 also is on) at a timing subsequent to the one timing, and the output terminal voltage is driven to the certain voltage, which is defined in conformity with the input signal voltage Vin, from the subsequent timing onward.

Furthermore, a driver circuit according to the present invention comprises: a follower transistor (121) and a switch (141) connected serially between an output terminal (T2) and a power supply (VSS); a current source (123) and a switch (142) connected serially between the output terminal (T2) and a power supply (VDD); and bias control means (12) for supplying the transistor (121) with a bias voltage based upon an input signal voltage. The switch (141) is turned on at one timing in a data output interval, thereby causing the transistor (121) to perform a follower operation to drive output terminal voltage Vout to the vicinity of a certain voltage defined in conformity with input signal voltage Vin. The switch (142) is turned on (switch 141 also is on) at a timing subsequent to the one timing, and the output terminal voltage is driven to the certain voltage, which is defined in conformity with the input signal voltage Vin, from the subsequent timing onward.

More specifically, a driver circuit according to this embodiment of practicing the present invention comprises: a source-follower first transistor (111) of first conductivity type and a first switch (131) connected serially between a high-potential power supply (VDD) and an output terminal (T2); a first current source (113) and a second switch (132) connected serially between a low-potential power supply (VSS) and the output terminal (T2); a source-follower transistor (121) of second conductivity type and a third switch (141) connected serially between the output terminal (T2) and the low-potential power supply (VSS); a second current source (123) and a fourth switch (142) connected serially between the high-potential power supply (VDD) and the output terminal (T2); first gate bias control means (11), to which input signal voltage Vin from the input terminal (T1) is applied, for controlling bias voltage of the gate of the transistor (111) of first conductivity type; second gate bias control means (12), to which the input signal voltage Vin is applied, for controlling bias voltage of the gate of the transistor (121) of second conductivity type; and preliminary charging/discharging means (13) for precharging or pre-discharging the output terminal (T2). Further, the first gate bias control means (11) is made capable of supplying a bias voltage such that a voltage difference between the bias voltage supplied to the gate of the transistor (111) of the first conductivity type and a desired voltage defined in conformity with the input signal voltage Vin will become equal to the gate-source voltage that prevails when current controlled by the first current source (113) flows into the transistor (111) of the first conductivity type. The second gate bias control means (12) is made capable of supplying a bias voltage such that a voltage difference between the bias voltage supplied to the gate of the transistor (121) of the second conductivity type and a desired voltage defined in conformity with the input signal voltage Vin will become equal to the gate-source voltage that prevails when current controlled by the second current source (123) flows into the transistor (121) of the second conductivity type.

In source-follower drive of the transistors (111, 121) according to this embodiment of the present invention, an interval for controlling the drain current of the transistors (111, 121) and an interval for cutting off this current [an interval for turning off the switches (132, 142)] are provided to reduce power consumption in the cut-off interval.

In one data output interval in which the input signal voltage Vin at the low potential level is input, the first to fourth switches (131, 132, 141 and 142) are all turned off in a first timing interval (times t0 to t1 in FIG. 2), as a result of which the output terminal (T2) is pre-discharged to a voltage below the desired voltage by the preliminary charging/discharging means (13).

In a second timing interval (times t1 to t2 in FIG. 2), preliminary discharge is halted and the first switch (131) is turned on. As a result, the source-follower operation of the transistor (111) of first conductivity type is enabled and the output terminal (T2) can be pulled up to the vicinity of a desired voltage. In this interval, static power consumption does not occur because no feed-through current flows from the high-potential power supply (VDD) to the low-potential power supply (VSS). Further, since voltage need not necessarily be determined rapidly in this interval, the transistor (111) of first conductivity type may have such a characteristic that the current driving capability varies gently while gradually decreasing when the gate-source voltage of this transistor is in the vicinity of the threshold voltage.

In a third timing interval (times t2 to t3 in FIG. 2), the second switch (132) is turned on while the first switch (131) is left in the ON state. As a result, the source-follower operation of the transistor (111) of the first conductivity type stabilizes rapidly when the drain current of the transistor (111) of the first conductivity type becomes equal to the current controlled by the first current source (113), and the output terminal (T2) can be driven to the desired voltage at high speed.

In another one output interval in which the input signal voltage Vin at the high potential level is input, the first to fourth switches are all turned off in a first timing interval (times t0' to t1' in FIG. 2), as a result of which the output terminal (T2) is precharged to a voltage greater than the desired voltage.

In a second timing interval (times t1' to t2' in FIG. 2), preliminary charging is halted and the third switch (141) is turned on. As a result, the source-follower operation of the transistor (121) of second conductivity type is enabled and the output terminal (T2) can be pulled down to the vicinity of a desired voltage. In this interval, no feed-through current flows from the high-potential power supply (VDD) to the low-potential power supply (VSS). Further, since voltage need not necessarily be determined rapidly in this interval, the transistor (121) of second conductivity type may have such a characteristic that the current driving capability varies gently while gradually decreasing when the gate-source voltage of this transistor is in the vicinity of the threshold voltage.

In a third timing interval (times t2' to t3' in FIG. 2), the fourth switch (142) is turned on while the third switch (141) is left in the ON state. As a result, the source-follower operation of the transistor (121) of the second conductivity type stabilizes rapidly when the drain current of the transistor (121) of the second conductivity type becomes equal to the current controlled by the second current source (123), and the output terminal (T2) can be driven to the desired voltage at high speed.

In the driver circuit according to this embodiment of the present invention, the source-follower operation of the transistors (111 and 121) is carried out even in the cut-off interval in which the switches (132 and 142) are turned off. During this period of time, drive up to the vicinity of the desired voltage can be achieved without any static power consumption. Thereafter, in an interval for controlling the drain current of the transistors, drive up to the desired voltage can be achieved with high voltage precision. As a result, power consumption can be reduced in comparison with the conventional driver circuits, described above with reference to FIGS. 15 and 17, etc., while a high output precision is maintained.

In the driver circuit according to this embodiment of the present invention, the currents controlled by the first current source (113) and second current source (123) should be levels at which the output terminal (T2) can be driven to the desired voltage rapidly by the source-follower operation of the transistor (111) of the first conductivity type and transistor (121) of the second conductivity type in the third timing interval (times t2 to t3 and t2' to t3' in FIG. 2). This will make it possible to reduce power consumption by holding current to a low level.

Figure 3:
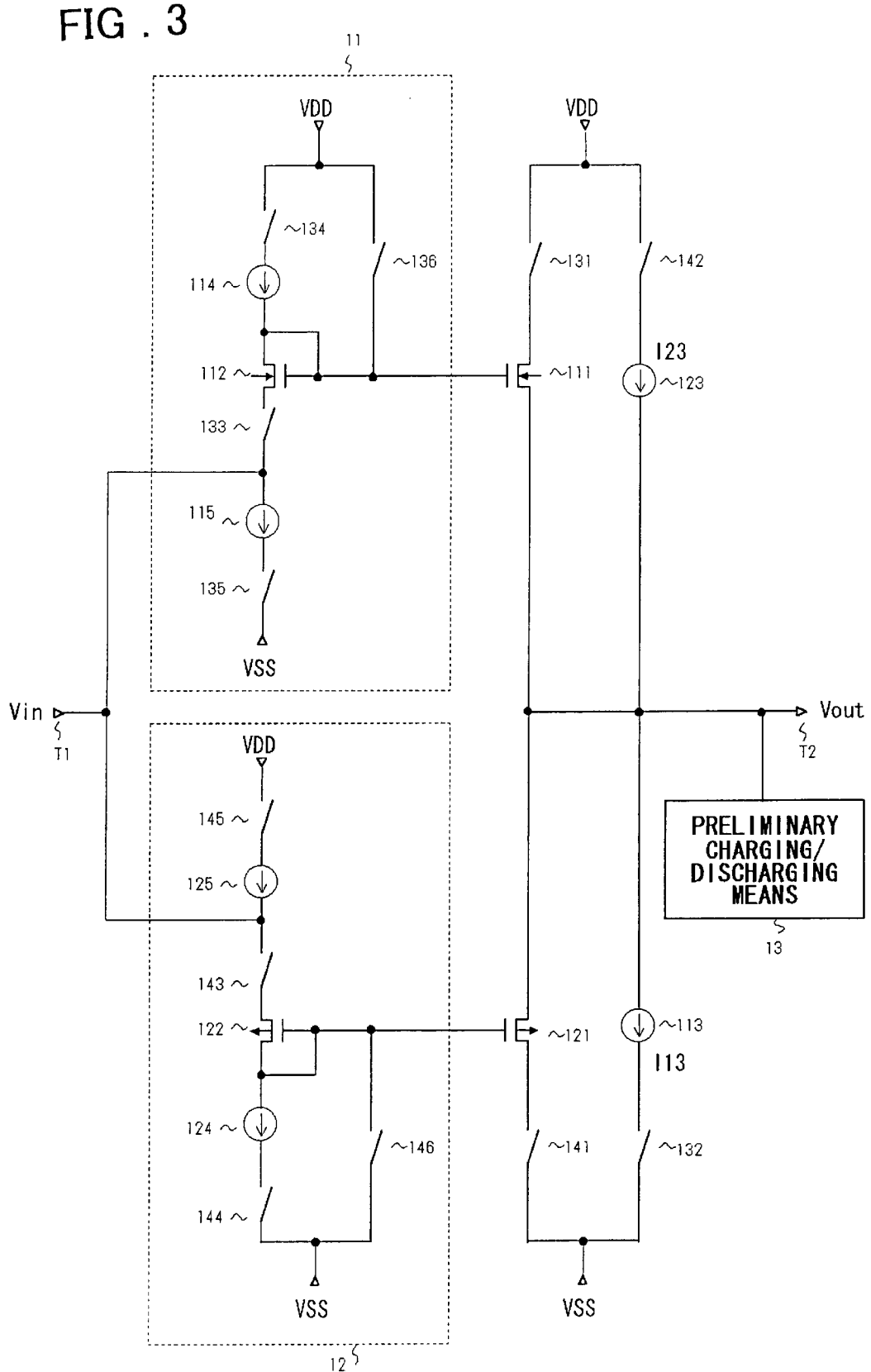
FIG. 3 is a diagram showing the structure of gate bias control means according to this embodiment.

In the driver circuit according to this embodiment of the present invention, the first gate bias control means (11), as shown in FIG. 3, preferably includes a third MOS transistor (112) of first conductivity type having a drain and gate connected in common with a gate of the first MOS transistor (111) and a source connected to the input terminal via a fifth switch (133); a third current source (114) and a sixth switch (134) connected serially between the drain of the third MOS transistor (112) and the a high-potential power supply (VDD); a fourth current source (115) and a seventh switch (135) connected serially between a connection node of the input terminal (T1) and fifth switch (133) and a low-potential power supply (VSS); and an eighth switch (136) connected between a common connection node of the gates of the first and third MOS transistors (111 and 112) and the high-potential power supply (VDD).

In the driver circuit according to this embodiment of the present invention, the second gate bias control means (12) preferably includes a fourth MOS transistor (122) of second conductivity type having a drain and gate connected in common with a gate of the second MOS transistor (121) and a source connected to the input terminal via a ninth switch (143); a fifth current source (124) and a tenth switch (144) connected serially between the drain of the fourth MOS transistor and the low-potential power supply (VSS); a sixth current source (125) and an 11th switch (145) connected serially between a connection node of the input terminal (T1) and ninth switch (143) and the high-potential power supply (VDD); and a 12th switch (146) connected between a common connection node of the gates of the second and fourth MOS transistors (121 and 122) and the low-potential power supply (VSS).

In control of the switches in the driver circuit according to this embodiment of the invention, the data output interval in which the input signal voltage Vin is at the low potential comprises four intervals, as shown in FIG. 4A. In a first timing interval (times t0 to t1), the output terminal (T2) is pre-discharged to a voltage below a desired voltage, the eighth switch (136) is turned on and the remaining first to seventh and ninth to 12th switches are already off. By turning on the eighth switch (136), the common gate of the first MOS transistor (111) and third MOS transistor (112) of the first conductivity type are charged to the voltage of the high-potential power supply (VDD).

In second timing interval (times t1 to t2), the output terminal (T2) continues to be pre-discharged, the eighth switch (136) is turned off and the fifth switch (133) is turned on. As a result, the gate bias voltage of the first MOS transistor (111) becomes a voltage shifted from the input signal voltage Vin by an amount equivalent to the threshold voltage of the third MOS transistor (112) owing to the action of the third MOS transistor (112).

In a third timing interval (times t2 to t3), the preliminary discharging of the output terminal (T2) is halted, the first switch (131) is turned on and the fifth switch (133) is already on. As a result, the source-follower operation of the first MOS transistor (111) of first conductivity type is enabled and the output terminal (T2) can be pulled up to a voltage shifted from the gate bias voltage by an amount equivalent to the threshold voltage of first MOS transistor (111).

In a fourth timing interval (times t3 to t4), the second switch (132) is turned on, the first switch (131) and the fifth switch (133) are already on, and the sixth switch (134) and seventh switch (135) are turned on. As a result, the current controlled by the third current source (114) flows into the third MOS transistor, whereby the gate-source voltage of the third MOS transistor is decided and the gate bias voltage of the third MOS transistor becomes a voltage shifted from the input signal voltage Vin by an amount equivalent to the gate-source voltage of the third MOS transistor (112). Further, the source-follower operation of the first MOS transistor (111) rapidly pulls the output terminal (T2) up to a voltage shifted from the gate bias voltage by an amount equivalent to the gate-source voltage of the first MOS transistor (111). Stability is quickly achieved. The gate-source voltage of the first MOS transistor (111) at this time is decided by current I13 controlled by the first current source (113). Accordingly, a desired voltage conforming to the input signal voltage Vin can be output to the output terminal (T2) by setting the currents of the first current source (113) and third current source (114) in optimum fashion. That is, if the currents of the first current source (113) and third current source (114) are set so as to equalize the gate-source voltages of the first MOS transistor (111) and third MOS transistor (112), then a voltage equal to the input signal voltage Vin can be output to the output terminal (T2).

The data output interval in which the input signal voltage Vin is at the high potential comprises four intervals, as shown in FIG. 4B. In a first timing interval (times t0' to t1'), the output terminal (T2) is precharged to a voltage above a desired voltage, the 12th switch (146) is turned on and the remaining first to 11th switches are already off. By turning on the 12th switch (146), the common gate of the second MOS transistor (121) and fourth MOS transistor (122) of the second conductivity type are discharged to the voltage of the low-potential power supply (VSS).

In second timing interval (times t1' to t2'), the output terminal (T2) continues to be precharged, the 12th switch (146) is turned off and the ninth switch (143) is turned on. As a result, the gate bias voltage of the second MOS transistor (121) becomes a voltage shifted from the input signal voltage Vin by an amount equivalent to the threshold voltage of the fourth MOS transistor (122) owing to the action of the fourth MOS transistor (122).

In a third timing interval (times t2' to t3'), the preliminary charging of the output terminal (T2) is halted, the third switch (141) is turned on and the ninth switch (143) is already on. As a result, the source-follower operation of the second MOS transistor (121) of second conductivity type is enabled and the output terminal (T2) can be pulled down to a voltage shifted from the gate bias voltage by an amount equivalent to the threshold voltage of second third MOS transistor (121).

In a fourth timing interval (times t3' to t4'), the fourth switch (142) is turned on, the third switch (141) and the ninth switch (143) are already on, and the 10th switch (144) and 11th switch (145) are turned on. As a result, the current controlled by the fifth current source (124) flows into the fourth MOS transistor (122), whereby the gate-source voltage of the fourth MOS transistor (122) is decided and the gate bias voltage of the second MOS transistor (121) becomes a voltage shifted from the input signal voltage Vin by an amount equivalent to the gate-source voltage of the fourth MOS transistor (122). Further, the source-follower operation of the second MOS transistor (121) rapidly pulls the output terminal (T2) down to a voltage shifted from the gate bias voltage by an amount equivalent to the gate-source voltage of the second MOS transistor (121). Stability is quickly achieved. The gate-source voltage of the second MOS transistor (121) at this time is decided by current I23 controlled by the second current source (123). Accordingly, a desired voltage conforming to the input signal voltage Vin can be output to the output terminal (T2) by setting the currents of the second current source (123) and fifth current source (124) in optimum fashion. That is, if the currents of the second current source (123) and fifth current source (124) are set so as to equalize the gate-source voltages of the second MOS transistor (121) and fourth MOS transistor (122), then a voltage equal to the input signal voltage Vin can be output to the output terminal (T2).

In the first gate bias control means (11) and second gate bias control means (12) according to this embodiment of the present invention, the fourth current source (115) is controlled to a current equal to that of the third current source (114), and the sixth current source (125) is controlled to a current equal to that of the fifth current source (124). As a result, even if a sufficient current cannot be supplied from the input terminal (T1), a gate bias voltage for the first MOS transistor (111) and second MOS transistor (121) can be provided rapidly with respect to the input signal voltage Vin in the fourth timing interval (times t3 to t4 and times t3' to t4' in FIGS. 4A and 4B).

Furthermore, if a sufficient current can be supplied from the input terminal (T1), a gate bias voltage for the first MOS transistor (111) and second MOS transistor (121) can be provided rapidly with respect to the input signal voltage Vin and, hence, the fourth current source (115), the seventh switch (135), the sixth current source (125) and the 11th switch (145) need not be provided.

In control of the preliminary charging/discharging means (13) in the driver circuit according to this embodiment of the invention, the preliminary charging or discharging of the output terminal (T2) is performed in both the first timing interval (times t0 to t1 and times t0' to t1' in FIGS. 4A and 4B) and second timing interval (times t1 to t2 and times t1' to t2' in FIGS. 4A and 4B). However, the preliminary charging or discharging may be performed in either the first timing interval or the second timing interval.

Figure 15:
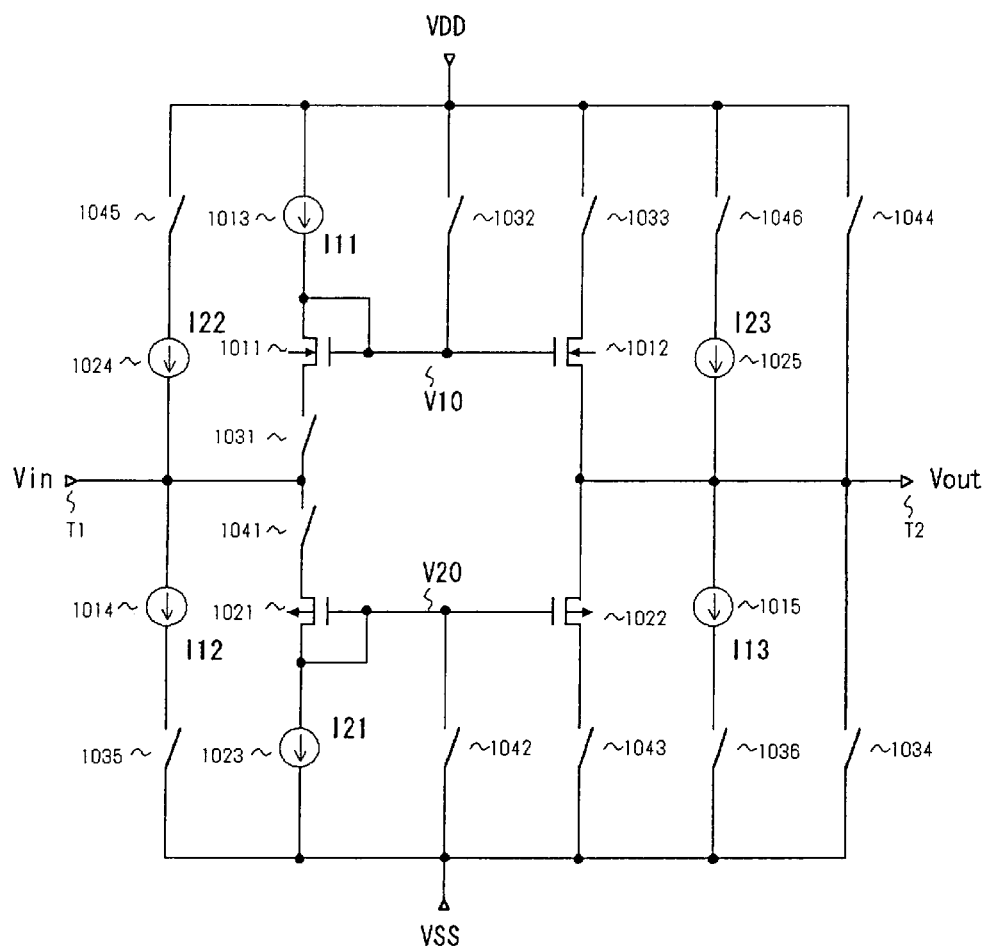
FIG. 15 is a diagram showing the structure of a driver circuit disclosed in the specification of Japanese Patent Kokai Publication JP-A-2000-338461.
Figure 17:
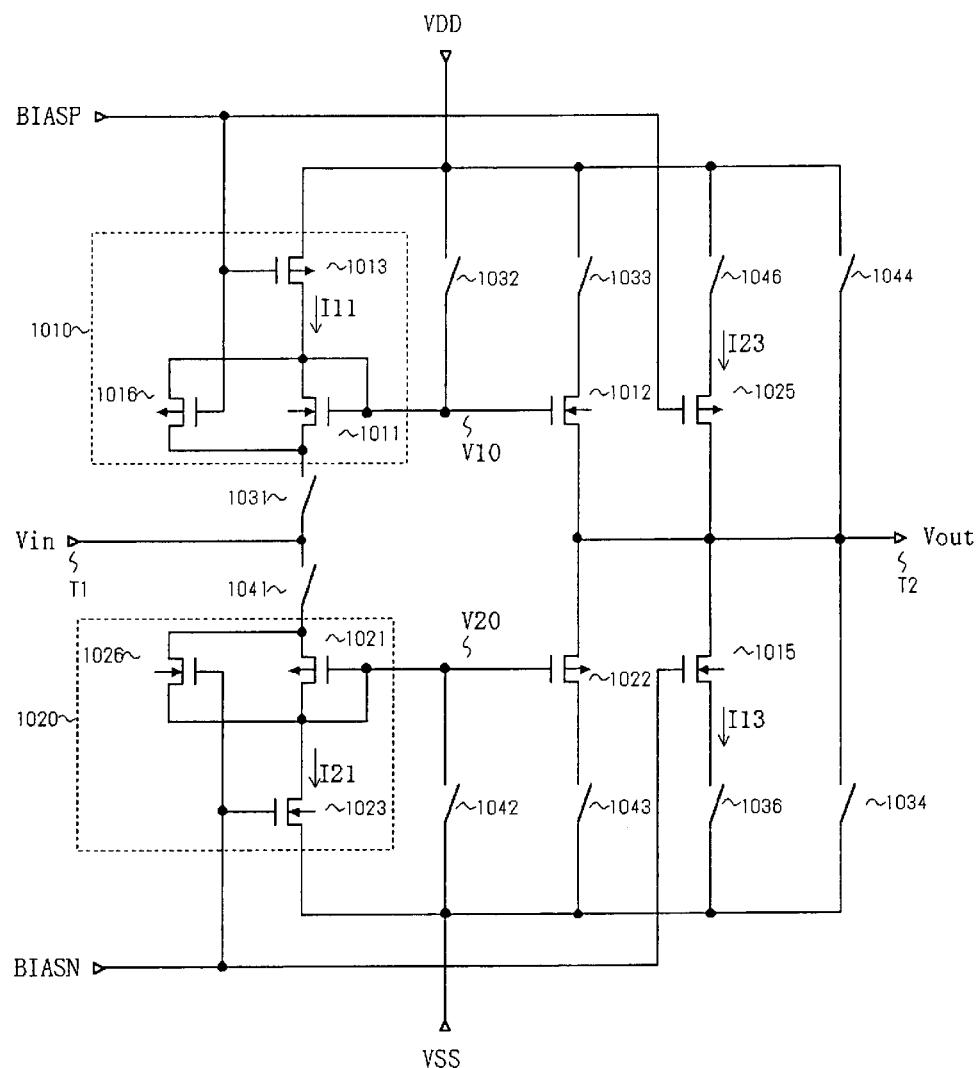
FIG. 17 is a diagram showing the structure of a driver circuit disclosed in the specification of Japanese Patent Kokai Publication JP-A-2000-338461.

The driver circuit according to the embodiment of the present invention reduces power consumption significantly in comparison with the driver circuits shown in FIGS. 15 and 17 and produces a voltage output of higher precision.

The driver circuit therefore is ideal for application to a data-line driver circuit (100 in FIG. 12) in an active matrix display device and is particularly well suited for application to a liquid crystal display device of a battery-driven portable terminal.

The present invention will now be described in greater detail with reference to the drawings illustrating various embodiments to which the invention is applied.

FIG. 1 is a diagram illustrating the structure of a driver circuit according to an embodiment of the present invention. The driver circuit according to this embodiment is one having a follower-type output transistor for producing a voltage, which is equal to an input signal voltage Vin, as an output voltage Vout.

More specifically, as shown in FIG. 1, the driver circuit comprises: an N-channel MOS transistor 111 having a drain connected to a high-potential power supply VDD via a switch 131 and a source connected to an output terminal T2; a P-channel MOS transistor 121 having a drain connected to a low-potential power supply VSS via a switch 141 and a source connected to the output terminal T2; a current source 113 and a switch 132 connected serially between the output terminal T2 and the low-potential power supply VSS; a current source 123 and a switch 142 connected serially between the output terminal T2 and the high-potential power supply VDD; gate bias control means 11, 12, which receive the input signal voltage Vin, for controlling gate voltage in such a manner that output voltage Vout will become equal to the input voltage Vin; and preliminary charging/discharging means 13 for precharging or pre-discharging the output terminal T2 in accordance with the input signal voltage Vin. The bias control means 11 is capable of supplying a bias voltage such that a voltage difference between the bias voltage supplied to the gate of the transistor 111 and the input signal voltage Vin will become equal to the gate-source voltage that prevails when current controlled by the current source 113 flows into the transistor 111. The second gate bias control means 12 is capable of supplying a bias voltage such that a voltage difference between the bias voltage supplied to the gate of the transistor 121 and the input voltage Vin will become equal to the gate-source voltage that prevails when current controlled by the current source 123 flows into the transistor 121. It should be noted that the order of the switch 132 and current source 113 connected serially between the output terminal T2 and power supply VSS may be reversed, as well as the order of the switch 142 and current source 143 connected serially between the output terminal T2 and power supply VDD. Further, an arrangement may be adopted in which the drain of the transistor 111 is connected to the power supply VDD and the switch 131 is connected between the source of this transistor and the output terminal T2, or an arrangement may be adopted in which the drain of the transistor 121 is connected to the power supply VSS and the switch 141 is connected between the source of this transistor and the output terminal T2.

FIG. 2 is a diagram illustrating the operation for controlling the switches in the driver circuit shown in FIG. 2. This is an example in which one data output interval comprises three drive intervals. The control operation according to this embodiment of the invention will be described with reference to FIGS. 1 and 2.

When the input signal voltage Vin is at the level of low potential, the preliminary charging/discharging means 13 pre-discharges the output terminal T2 to a voltage below the input signal voltage Vin and the switches 131, 132, 141 and 142 are all off in the interval t0 to t1.

In the interval t1 to t2, the operation of the preliminary charging/discharging means 13 is halted and only the switch 131 is turned on, whereby the output voltage is driven to the vicinity of Vin by the source-follower operation of the N-channel MOS transistor 111. No static power consumption occurs in this interval.

In the interval t2 to t3, the switch 132 is turned on, so that both switches 131 and 132 are on. As a result, the current controlled by the current source 113 flows into the transistor 111, whereby the gate-source voltage of the transistor 111 is determined rapidly to realize a highly precise output.

When the input signal voltage Vin is at a high potential level, the preliminary charging/discharging means 13 precharges the output terminal T2 to a voltage above the input signal voltage Vin and the switches 131, 132, 141 and 142 are all off in the interval t0' to t1'.

In the interval t1' to t2', the operation of the preliminary charging/discharging means 13 is halted and only the switch 141 is turned on, whereby the output voltage is driven to the vicinity of Vin by the source-follower operation of the P-channel MOS transistor 121. No static power consumption occurs in this interval.

In the interval t2' to t3', the switch 142 is turned on, so that both switches 141 and 142 are on. As a result, the current controlled by the current source 123 flows into the transistor 121, whereby the gate-source voltage of the transistor 121 is determined rapidly to realize a highly precise output.

The above-described operation for controlling the switches is controlled by a switch control circuit (see switch control means 101 shown in FIG. 12 but not in FIG. 1) that controls the driver circuit. As long as the circuit arrangement of the switch control circuit satisfies the functional specifications shown in FIG. 2, any circuit arrangement may be used.

In the above-described embodiment, switches 131 and 141 are provided for exercising control to stop or deactivate the operation of transistors 111 and 121 respectively and hence such a circuit configuration may well be adopted in which switches 131 and 141 are replaced by any circuit means, which are provided for example in gate-bias control means 11 and 12, for controlling changeover between activation and deactivation of transistors 111 and 121 respectively. With this circuit configuration, switches 131 and 141 may well be omitted.

This embodiment is such that if one data output interval is comparatively long, as in a data-line driver circuit for a low-resolution panel such as a TFT (thin-film transistor) LCD (liquid crystal display device) for a cellular telephone, the interval t0 to t2 and the interval t0' to t2' are lengthened and settling time, which finally determines pixel write voltage in one data output interval, is allocated to interval t2 to t3 and interval t2' to t3', thereby making it possible to achieve a highly precise pixel write voltage and to reduce power consumption by a wide margin.

FIG. 3 is a diagram showing an example of the structures of the bias control means 11 and 12 in the driver circuit of the embodiment shown in FIG. 1. As shown in FIG. 3, the bias control means 11 includes an N-channel MOS transistor 112 having a drain and gate connected in common with the gate of the transistor 111 and a source connected to the input terminal T1 via a switch 133; a current source 114 having one end connected to the drain of the N-channel transistor 112; a switch 134 connected between the other end of the current source 114 and the power supply VDD; a current source 115 having one end connected to the node of the input terminal T1 and switch 133; a switch 135 connected between the other end of the current source 115 and the power supply VSS; and a switch 136 connected between a common connection node of the gates of the N-channel MOS transistors 111, 112 and the power supply VDD.

The bias control means 12 includes a P-channel MOS transistor 122 having a drain and gate connected in common with the gate of the transistor 121 and a source connected to the input terminal T1 via a switch 143; a current source 124 having one end connected to the drain of the P-channel transistor 122; a switch 144 connected between the other end of the current source 124 and the power supply VSS; a current source 125 having one end connected to the node of the input terminal T1 and switch 143; a switch 145 connected between the other end of the current source 125 and the power supply VDD; and a switch 146 connected between a common connection node of the gates of the P-channel MOS transistors 121 and 122 and the power supply VSS. In FIG. 3, the preliminary charging/discharging means 13, the switches 131, 132, 141 and 142, the current sources 113 and 123 and the transistors 111 and 121 are arranged in a manner similar to that shown in FIG. 1.

FIGS. 4A and 4B are diagrams in which the operation for controlling the switches of the driver circuits shown in FIG. 3 is summarized in table form. Specifically, the example of the control operation depicted in FIGS. 4A and 4B is such that one data output interval comprises four drive intervals. FIGS. 4A and 4B illustrate the on and off states of the switches in one data interval of low potential level and one data interval of high potential level, respectively, in table form. The operation of the bias control means 11 and 12 will be described with reference to FIGS. 4A and 4B.

When the input signal voltage Vin is at the low potential level: In the interval t0 to t1, only the switch 136 is turned on and the gates of the transistors 111 and 112 are charged to the high-potential power supply VDD.

In the interval t1 to t2, the switch 136 is turned off and the switch 133 is turned on, whereupon the gates of the transistors 111 and 112 change in such a manner that the gate-source voltage of the transistor 112 attains a threshold voltage.

In the interval t2 to t3, the switch 131 is turned on so that the transistor 111 is made to perform a source-follower operation, whereupon the transistor 111 also pulls up the voltage of the pre-discharged output terminal T2 so that the gate-source voltage changes to a voltage in the vicinity of the threshold voltage. The output voltage Vout, therefore, is driven to the vicinity of Vin.

In the interval t3 to t4, the switches 132, 133, 134 and 135 are turned on. When this is done, the output voltage Vout will be driven to a voltage equal to Vin rapidly if the current sources 113, 114 and 115 have been set so as to equalize the gate-source voltages of the transistors 111 and 112.

When the input signal voltage Vin is at the high potential level: In the interval t0' to t1', only the switch 146 is turned on and the gates of the transistors 121 and 122 are charged to the low-potential power supply VSS.

In the interval t1' to t2', the switch 146 is turned off and the switch 143 is turned on, whereupon the gates of the transistors 121 and 122 change in such a manner that the gate-source voltage of the transistor 122 attains a threshold voltage.

In the interval t2' to t3', the switch 141 is turned on so that the transistor 121 is made to perform a source-follower operation, whereupon the transistor 121 also pulls down the voltage of the precharged output terminal T2 so that the gate-source voltage changes to a voltage in the vicinity of the threshold voltage. The output voltage Vout, therefore, is driven to the vicinity of Vin.

In the interval t3' to t4', the switches 142, 143, 144 and 145 are turned on. When this is done, the output voltage Vout will be driven to a voltage equal to Vin rapidly if the current sources 123, 124 and 125 have been set so as to equalize the gate-source voltages of the transistors 121 and 122. It should be noted that the switch pairs 133 and 143, the switch pairs 134 and 144, the switch pairs 135 and 145, and the switch pairs 136 and 146 might be operated at the same timing.

Figure 5:
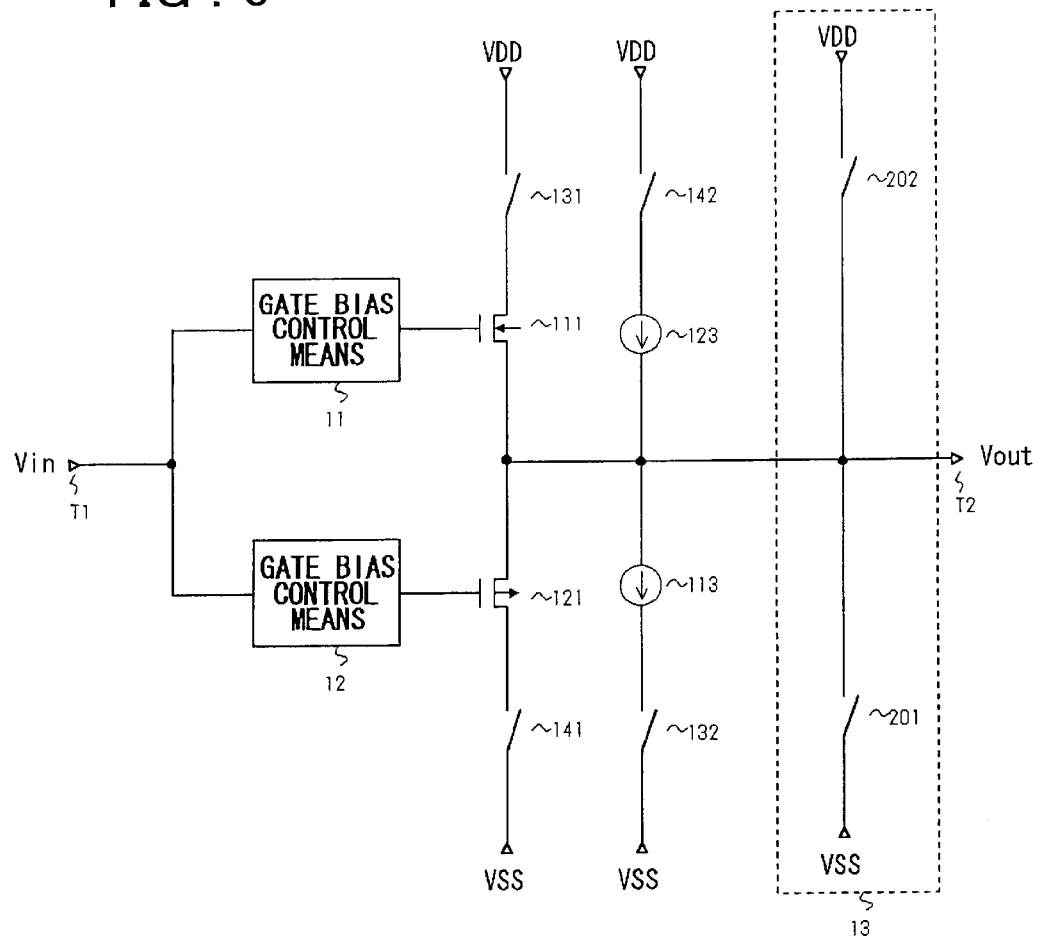
FIG. 5 is a diagram illustrating the structure of preliminary charging/discharging means according to this embodiment.

FIG. 5 is a diagram illustrating an example of the structure of the preliminary charging/discharging means (precharging means) 13 in the driver circuit shown in FIGS. 1 and 3. The arrangement of FIG. 5, which is for precharging or pre-discharging the output terminal to the power supply voltage VDD or VSS, includes a switch 202 connected between the output terminal T2 and the high-potential power supply VDD, and a switch 201 connected between the output terminal T2 and the low-potential power supply VSS.

In the pre-discharging operation, the output terminal T2 is discharged to the low-potential power supply VSS (timings t0 to t1 in FIG. 2 and timings t0 to t2 in FIG. 4A) in response to the ON state of the switch 201. In the precharging operation, the output terminal T2 is charged to the high-potential power supply VDD (timings t0' to t1' in FIG. 2 and timings t0' to t2' in FIG. 4B) in response to the ON state of the switch 202.

Figure 6:
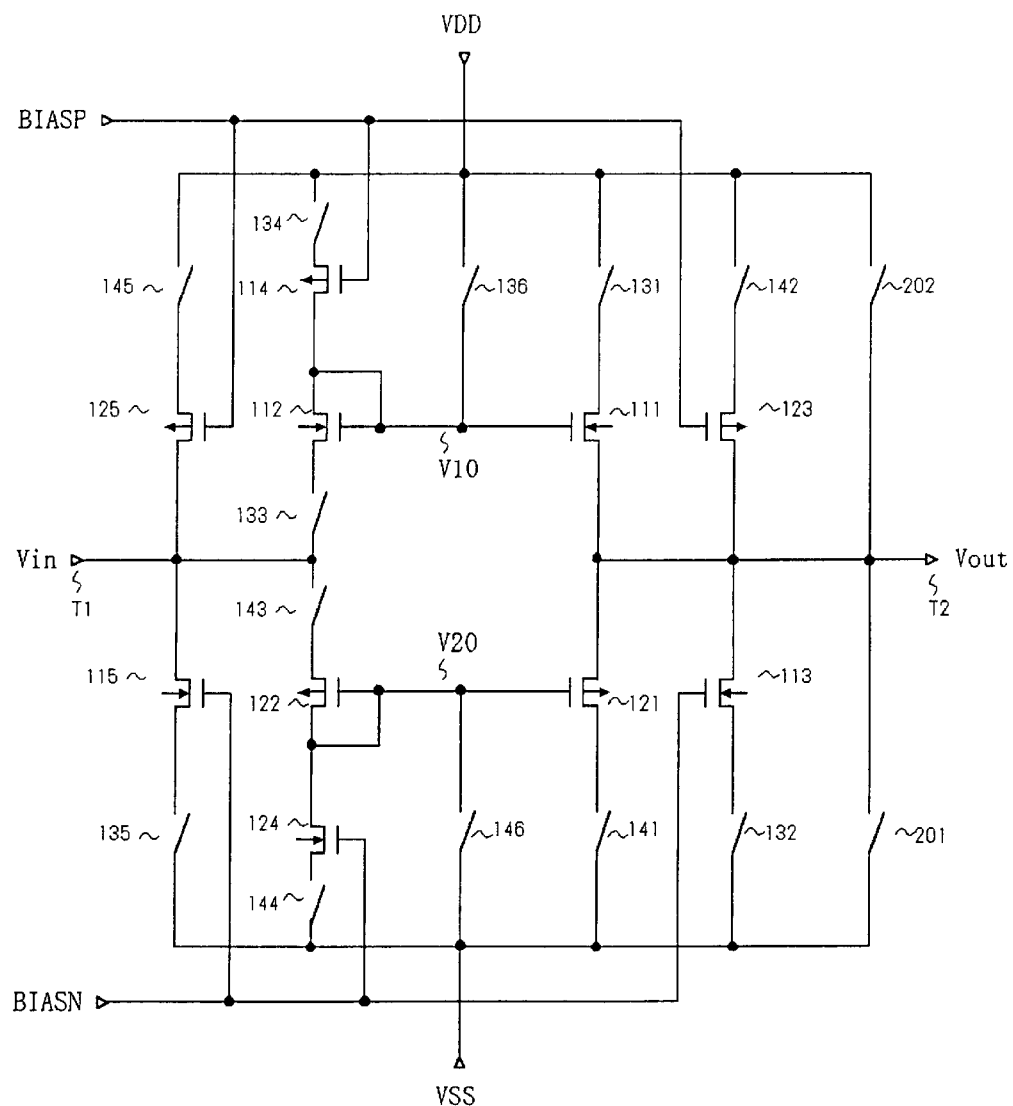
FIG. 6 is a diagram illustrating the structure of a second embodiment of the present invention.

FIG. 6 is a diagram illustrating the structure of a second embodiment of the present invention, in which components identical with those shown in FIG. 1 are designated by like reference characters.

As shown in FIG. 6, the driver circuit includes the N-channel MOS transistor 112 having its source connected to the input terminal T1 via the switch 133 and having its gate and drain tied together; the switch 134 and constant-current source 114 (P-channel MOS transistor) provided between the drain of the N-channel MOS transistor 112 and high-potential power supply VDD; and the N-channel MOS transistor 111 having a drain connected to the high-potential power supply VDD via the switch 131, a gate connected in common with the gate of the N-channel MOS transistor 112 and a source connected to the output terminal T2. The common gate of the N-channel MOS transistors 111, 112 is connected to the high-potential power supply VDD via the switch 136, the switch 145 and constant-current source 125 are connected serially between the input terminal T1 and the high-potential power supply VDD, the switch 142 and constant-current source 123 are connected serially between the output terminal T2 and the high-potential power supply VDD, and the switch 202, which constitutes precharging means, is provided between the output terminal T2 and high-potential power supply VDD.

The driver circuit further includes the P-channel MOS transistor 122 having its source connected to the input terminal T1 via the switch 143 and having its gate and drain tied together; the switch 144 and constant-current source 124 (N-channel MOS transistor) provided between the drain of the P-channel MOS transistor 122 and low-potential power supply VSS; and the P-channel MOS transistor 121 having a drain connected to the low-potential power supply VSS via the switch 141, a gate connected in common with the gate of the P-channel MOS transistor 122 and a source connected to the output terminal T2. The common gate of the P-channel MOS transistors 121 and 122 is connected to the low-potential power supply VSS via the switch 146, the switch 115 and constant-current source 135 are connected serially between the input terminal T1 and the low-potential power supply VSS, the switch 132 and constant-current source 113 are connected serially between the output terminal T2 and the low-potential power supply VSS, and the switch 201, which constitutes pre-discharging means, is provided between the output terminal T2 and low-potential power supply VSS.

The gates of the transistors 125, 114 and 123 are connected to a bias voltage source BIASP, and the gates of the transistors 115, 124 and 113 are connected to a bias voltage source BIASN. FIG. 6 is the result of applying the present invention to the arrangement shown in FIG. 15. The arrangement of FIG. 6 differs from that of FIG. 15 in the manner in which the switches 131 (1033), 132 (1036), 141 (1043) and 142 (1046) are controlled, in the provision of switch 134 between the current source 114 and high-potential power supply VDD, and in the provision of switch 144 between the current source 124 and low-potential power supply VSS.

Figure 16A:
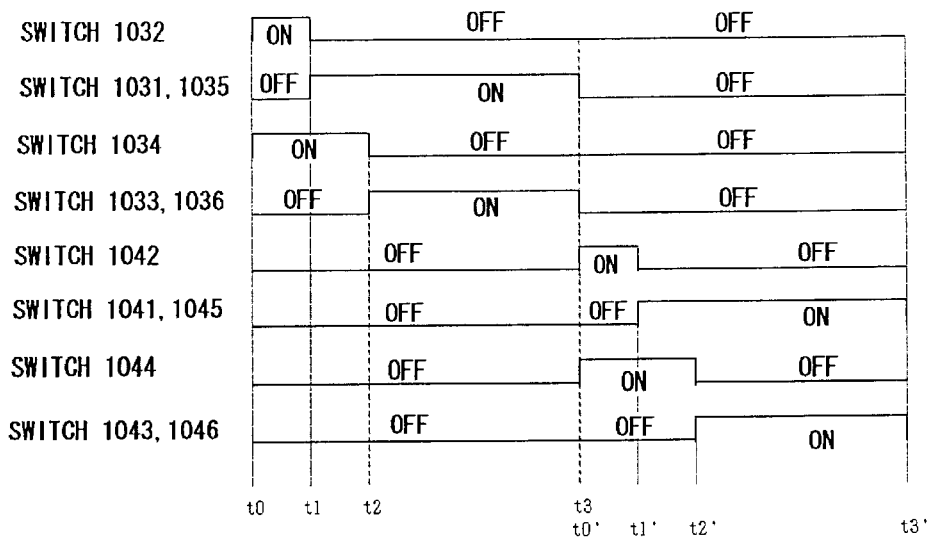
FIG. 16A is a timing chart useful in describing a switch control operation disclosed in the specification of Japanese Patent Kokai Publication JP-A-2000-338461.
Figure 16B:
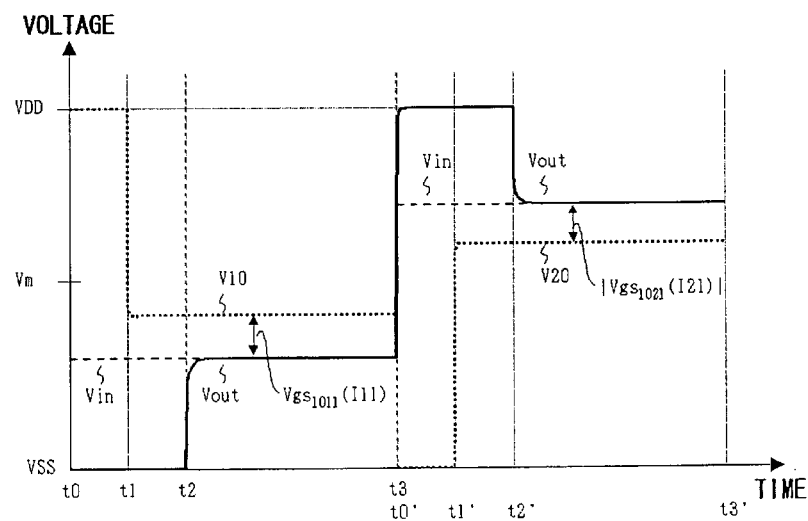
FIG. 16B is a waveform diagram illustrating voltage waveforms of an internal node, input signal voltage and output voltage.

More specifically, in the driver circuit according to the prior art shown in FIG. 15, the switches 1033 and 1036 are turned on simultaneously at time t2 when the input signal is at the low potential, as shown in FIG. 16.

By comparison, in this embodiment, the switch 131 is turned on at time t2 and then the switch 132 is turned on at step t3, as shown in the timing chart of FIG. 9.

With the circuit shown in FIG. 15, the switches 1043 and 1046 are turned on simultaneously at time t2' when the input signal is at the high level, as shown in FIG. 16.

By comparison, in this embodiment, the switch 141 is turned on at time t2' and then the switch 142 is turned on at step t3', as shown in the timing chart of FIG. 9. Consumed current is reduced by such switch control.

Further, in a case where the input signal voltage is at the low potential, the switch 134 connected between the current source 114 and high-potential power supply VDD also is turned on for the first time at t3 to supply the transistor 112 with current.

In a case where the input signal voltage is at the high potential, the switch 144 connected between the current source 124 and low-potential power supply VSS also is turned on for the first time at t3' to supply the transistor 122 with current.

Figure 7:
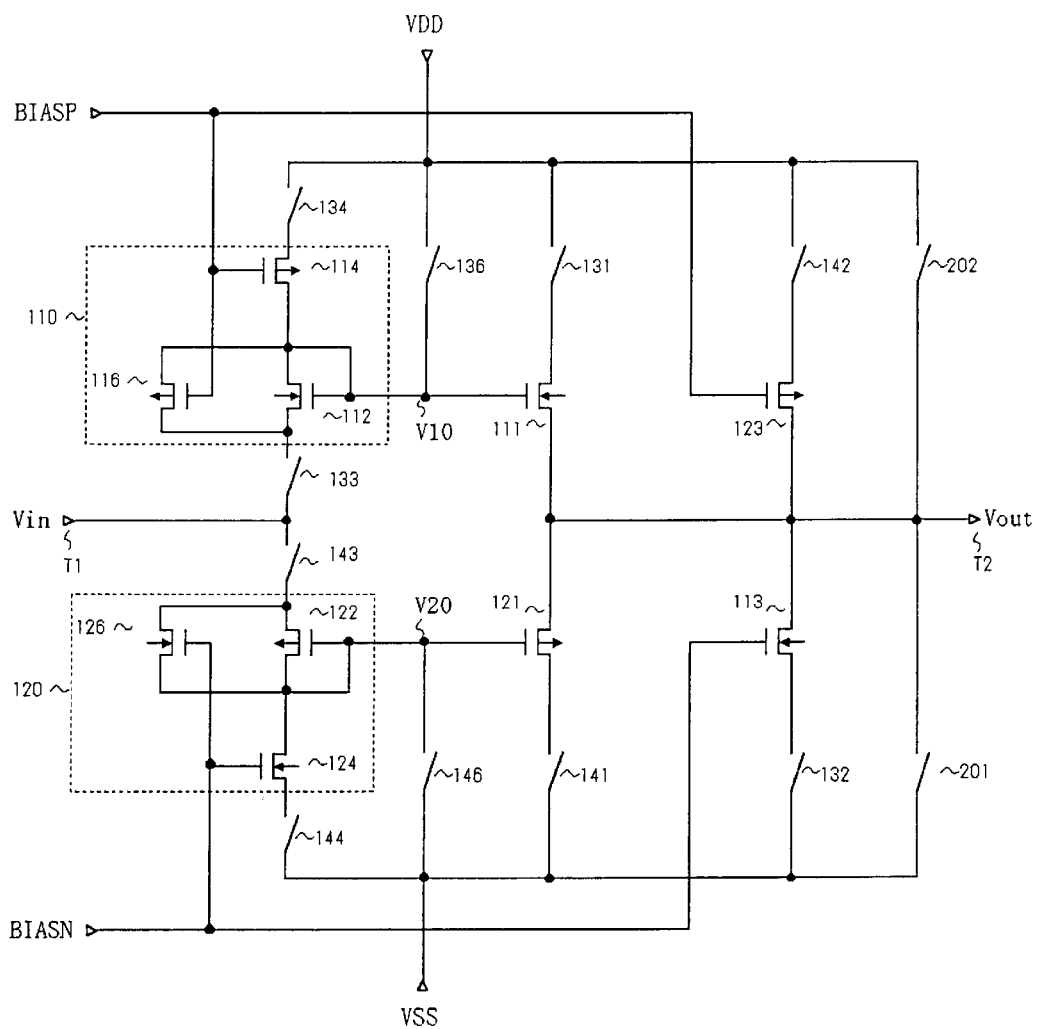
FIG. 7 is a diagram illustrating the structure of a third embodiment of the present invention.

FIG. 7 is a diagram illustrating the structure of a third embodiment of the present invention, in which components identical with those shown in FIG. 6 are designated by like reference characters. The driver circuit shown in FIG. 7 is obtained by eliminating the current sources 115 and 125 and the switches 135 and 145 from the driver circuit of FIG. 6 and adding on a P-channel MOS transistor 116 and an N-channel MOS transistor 126. The P-channel MOS transistor 116 has a source and drain connected to the gate (drain) and source, respectively, of the N-channel MOS transistor 112, and a gate to which the voltage BIASP is applied. The N-channel MOS transistor 126 has a source and drain connected to the gate (drain) and source, respectively, of the P-channel MOS transistor 122, and a gate to which the voltage BIASN is applied. The voltage BIASP is supplied also to the gates of the P-channel MOS transistors 114, 123 that constitute the constant-current sources. The voltage BIASN is supplied also to the gates of the N-channel MOS transistors 113, 124 that constitute the constant-current sources. The P-channel MOS transistor 116 has a threshold voltage lower than that of the P-channel MOS transistor 114 and possesses a current supply capability sufficiently greater than that of the P-channel MOS transistor 114 with respect to the same gate voltage. The N-channel MOS transistor 126 also has a threshold voltage lower than that of the N-channel MOS transistor 124 and possesses a current supply capability sufficiently greater than that of the N-channel MOS transistor 124 with respect to the same gate voltage. The circuit block consisting of the N-channel MOS transistor 112 and P-channel MOS transistors 114 and 116 is represented by a circuit block 110, and the circuit block consisting of the P-channel MOS transistor 122 and N-channel MOS transistors 124 and 126 is represented by a circuit block 120. The P-channel MOS transistor 116 turns on when the input voltage Vin is in the vicinity of the power supply voltage VDD and the N-channel MOS transistor 112 is about to turn off, and hence the transistor 116 functions in such a manner that the current controlled by the constant-current source 114 flowing between the input terminal T1 and power supply VDD will not be cut off. Further, the N-channel MOS transistor 126 turns on when the input voltage Vin is in the vicinity of the power supply voltage VSS and the N-channel MOS transistor 122 is about to turn off, and hence the transistor 126 functions in such a manner that the current controlled by the constant-current source 124 flowing between the input terminal T1 and power supply VSS will not be cut off. Accordingly, the circuit block 110 and switches 133 and 134 in FIG. 7 can perform an operation similar to that of the constant-current source 125 and switch 145 in FIG. 6, and the circuit block 120 and switches 143 and 144 in FIG. 7 can perform an operation similar to that of the constant-current source 115 and switch 135 in FIG. 6. Thus the driver circuit of FIG. 7 is capable of operating in a manner similar to that of FIG. 6.

Figure 8:
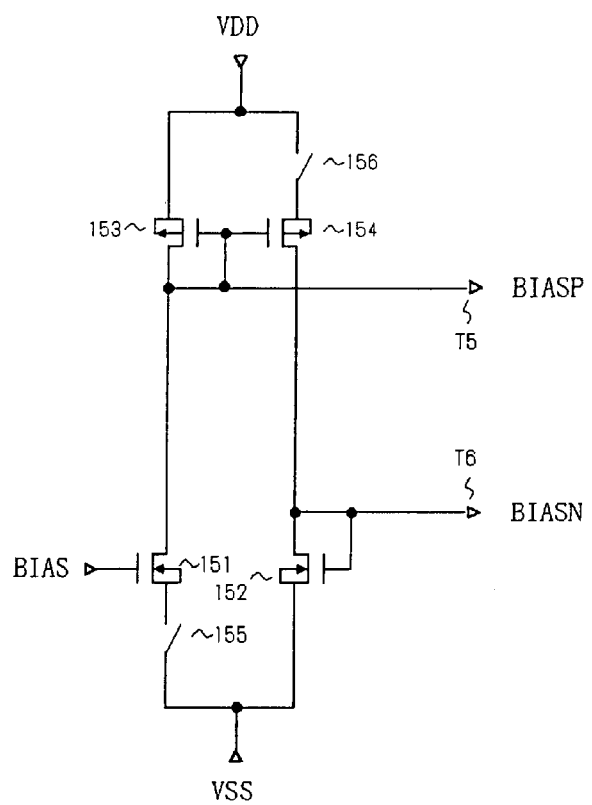
FIG. 8 is a diagram illustrating the structure of a bias circuit according to an embodiment of the present invention.

FIG. 8 is a diagram of a bias circuit for supplying the bias voltages BIASP, BIASN to the gates of the current-source transistors in the driver circuit shown in FIGS. 6 and 7. As shown in FIG. 8, the bias circuit includes a P-channel MOS transistor 153 whose source is connected to the high-potential power supply VDD and whose drain and gate are tied together; a P-channel MOS transistor 154 whose source is connected to the high-potential power supply VDD via a switch 156 and whose gate is connected in common with the gate of the P-channel MOS transistor 153 and to a bias voltage terminal T5; an N-channel MOS transistor 152 having a drain connected to the drain of the P-channel MOS transistor 154, a source connected to the low-potential power supply VSS and a gate connected to the drain; and an N-channel MOS transistor 151 having a drain connected to the drain of the P-channel MOS transistor 153, a source connected to the low-potential power supply VSS via a switch 155, and a gate to which a bias voltage BIAS is applied. The node of the connection between the gate and drain of the P-channel MOS transistor 153 is connected to the bias voltage terminal T5 and outputs the bias voltage BIASP, and the node of the connection between the gate and drain of the N-channel MOS transistor 152 is connected to a bias voltage terminal T6 and outputs the bias voltage BIASN.

In intervals t0 to t2 and t0' to t2' in FIG. 2 and in intervals t0 to t3 and t0' to t3' in FIG. 4, it is not necessary for the current control transistors (current sources) to be operated and therefore the bias circuit also can be shut down.

Accordingly, in FIG. 8, halting operation in these intervals through use of the switches 155 and 156 can reduce power consumption further.

Figure 9A:
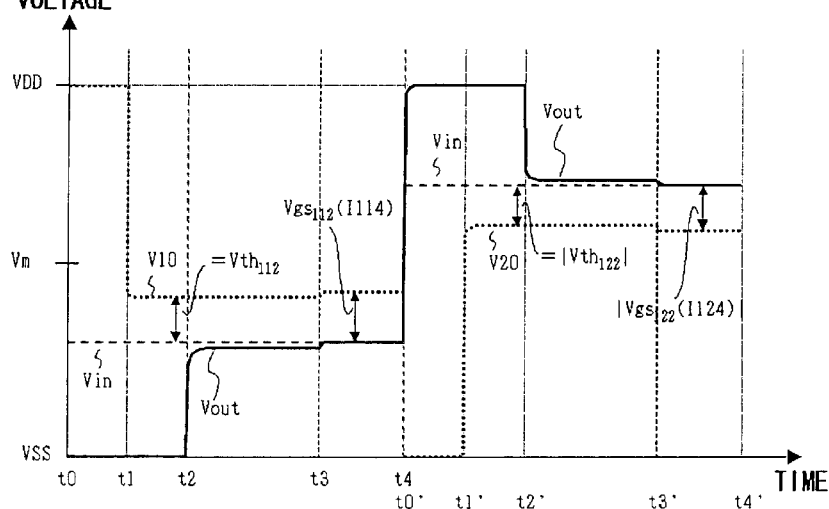
FIG. 9A is a timing chart useful in describing a switch control operation in the embodiments shown in FIGS. 6 and 8.

FIGS. 9A and 9B are diagrams useful in describing an example of operation for controlling the switches in the driver circuits shown in FIGS. 6 and 8. FIG. 9A is a timing chart for describing the switch control operation according to the embodiment of the invention shown in FIGS. 6 and 8.

FIG. 9B is a waveform diagram illustrating voltage waveforms of an internal node, input signal voltage and output voltage in a case where the driver circuit of FIG. 6 is constructed using enhancement-type transistors. In FIGS. 9A and 9B, one data output interval in a case where the input signal voltage is low-potential data is divided into four intervals (timing intervals). Pre-discharging is carried out in timing interval t0 to t2 and switch 131 is turned on in timing interval t2 to t4. In timing interval t3 to t4, switches 132, 134, 135 are turned on and, in addition, switches 155 and 156 are turned on to supply bias voltage.

At time t0, switch 201 is turned on to discharge the output terminal T2, and switch 136 is turned on so that node V10 attains the high-potential power supply VDD.

At time t1, the switch 136 is turned off, the switch 133 is turned on and the node V10 attains a voltage value shifted from the input signal voltage Vin by an amount equivalent to a threshold voltage Vth112 of the transistor 112. It should be noted that the threshold voltage is represented by a potential for which the source is the reference. The node voltage V10 is represented by the following equation:

$$V10 = Vin + Vth112$$

At time t2, the switch 201 is turned off, the switch 131 is turned on and the output voltage Vout attains a value shifted from the node voltage V10 by an amount equivalent to a threshold voltage Vth111 of the transistor 111. The output voltage Vout is represented by the following equation:

$$Vout = V10 - Vth111$$
$$= Vin + Vth112 - Vth111$$

In a case where the capacitive load connected to the output terminal T2 is driven, the output voltage Vout pulled up by the source-follower operation of the transistor 111 in the interval t2 to t3 takes on a value slightly lower than that of the voltage Vin even if threshold voltages Vth111, Vth112 of the transistors 111 and 112, respectively, are equal. The reason for this is that in the source-follower operation of the transistor 111, current driving capability gradually declines as the gate-source voltage of the transistor 111 approaches the threshold voltage, as a result of which the voltage of the capacitive load cannot be changed up to the value of the voltage Vin within one data output interval.

At time t3, the switches 132, 134 and 135 are turned on and, in addition, so are the switches 155 and 156 so that the bias circuit (FIG. 8) operates. The bias voltage BIASP is supplied to the gates of the current-source transistors 114, 123 and 125, the bias voltage BIASN is supplied to the gates of the current-source transistors 124, 113 and 115, the node voltage V10 takes on a voltage shifted from the input signal voltage Vin by the gate-source voltage Vgs112(I114) of the transistor 112 (the drain current is the current I114 of the current source 114), and the output voltage Vout takes on a voltage shifted from the voltage V10 by the gate-source voltage Vgs111(I113) of the transistor 111 (the drain current is the current I113 of the current source 113). It should be noted that the gate-source voltage Vgs is represented by the potential of the gate with respect to the source. We have the following:

$$V10 = Vin + Vgs112(I114)$$

$$Vout = V10 - Vgs111(I113)$$
$$= Vin + Vgs112(I114) - Vgs111(I113)$$

Accordingly, if the currents I113 and I114 controlled by the constant-current sources 113 and 114 are set in such a manner that the gate-source voltages Vgs111(I113), Vgs112 (I114) of the transistors 111, 112 are equalized, then the output voltage Vout will become equal to the input signal voltage Vin.

Further, in FIGS. 9A and 9B, one data output interval in a case where the input signal voltage is high-potential data is divided into four intervals (timing intervals). Precharging is carried out in timing interval t0' to t2' and switch 141 is turned on in timing interval t2' to t4'. In timing interval t3' to t4', switches 142, 144 and 145 are turned on and, in addition, switches 155 and 156 are turned on to supply bias voltage.

At time t0', switch 202 is turned on to charge the output terminal T2, and switch 146 is turned on so that node V20 attains the low-potential power supply VSS.

At time t1', the switch 146 is turned off, the switch 143 is turned on and the node V20 attains a voltage value shifted from the input signal voltage Vin by an amount equivalent to a threshold voltage Vth122 of the transistor 122. The node voltage V20 is represented by the following equation:

$$V20 = Vin + Vth122$$

At time t2', the switch 202 is turned off, the switch 141 is turned on and the output voltage Vout attains a value shifted from the node voltage V20 by an amount equivalent to a threshold voltage Vth121 of the transistor 121. The output voltage Vout is represented by the following equation:

$$Vout = V20 - Vth121$$
$$= Vin + Vth122 - Vth121$$

In a case where the capacitive load connected to the output terminal T2 is driven, the output voltage Vout pulled down by the source-follower operation of the transistor 121 in the interval t2' to t3' takes on a value slightly higher than that of the voltage Vin even if threshold voltages Vth121 and Vth122 of the transistors 121 and 122, respectively, are equal. The reason for this is that in the source-follower operation of the transistor 121, current driving capability gradually declines as the gate-source voltage of the transistor 121 approaches the threshold voltage, as a result of which the voltage of the capacitive load cannot be changed up to the value of the voltage Vin within one data output interval.

At time t3', the switches 142, 144 and 145 are turned on and, in addition, so are the switches 155 and 156 so that the bias circuit operates. The bias voltage BIASP is supplied to the gates of the current-source transistors 114, 123 and 125, the bias voltage BIASN is supplied to the gates of the current-source transistors 124, 113 and 115, the node voltage V20 takes on a voltage shifted from the input signal voltage Vin by the gate-source voltage Vgs122(I124) of the transistor 122 (the drain current is the current I124 of the current source 124), and the output voltage Vout takes on a voltage shifted from the voltage V20 by the gate-source voltage Vgs121(I123) of the transistor 121 (the drain current is the current I123 of the current source 123). We have the following:

$$V20 = Vin + Vgs122(I124)$$

$$Vout = V20 - Vgs121(I123)$$
$$= Vin + Vgs122(I124) - Vgs121(I123)$$

Accordingly, if the currents I123 and I124 controlled by the constant-current sources 123 and 124 are set in such a manner that the gate-source voltages Vgs121(I123) and Vgs122(I124) of the transistors 121 and 122 are equalized, then the output voltage Vout will become equal to the input signal voltage Vin.

Figure 10:
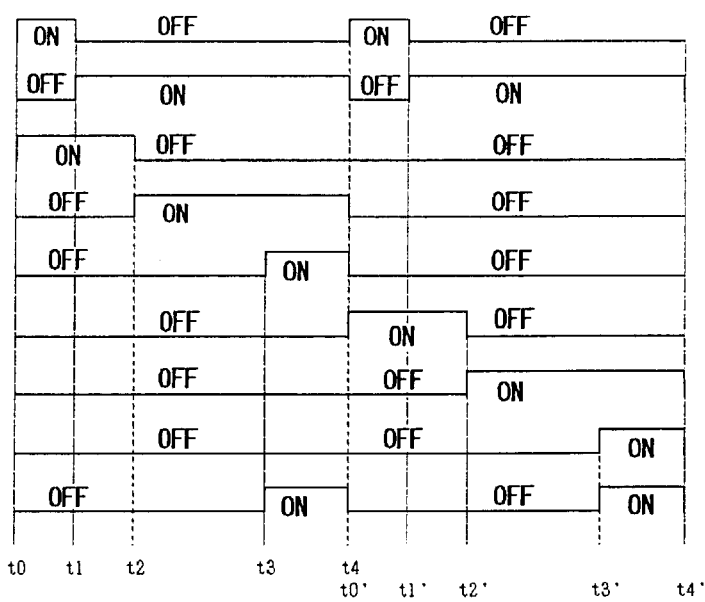
FIG. 10 is a timing chart useful in describing a switch control operation in the embodiments shown in FIGS. 7 and 8.

FIG. 10 is a diagram illustrating an example of an operation for controlling the switches of the driver circuits shown in FIGS. 7 and 8. Switch control in FIG. 10 is basically similar to that of FIG. 9A except for the fact that control of switches 135 and 145 in FIG. 6 is absent and the fact that the control timings of some of the switches share the same control timings.

Figure 11:
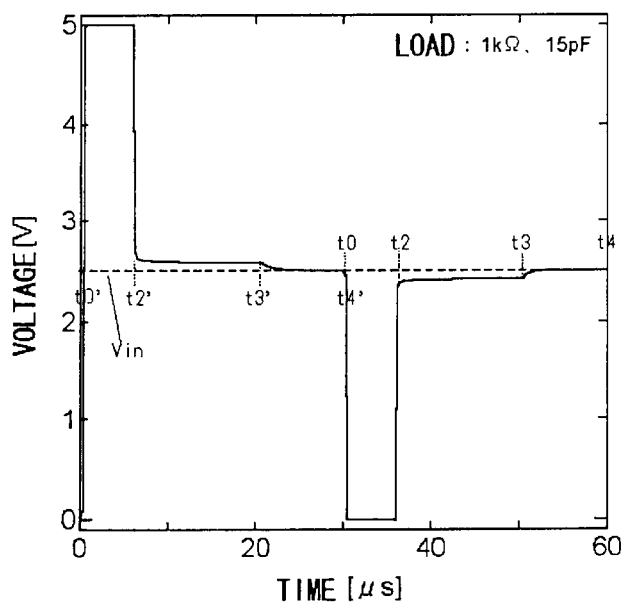
FIG. 11 is a graph illustrating an example of results of a circuit simulation in switch control according to the present invention.

FIG. 11 is a graph illustrating results of a circuit simulation (voltage waveforms) of operation of the driver circuit when the switch control operation illustrated in FIG. 9 is executed. Specifically, FIG. 11 illustrates input voltage and output voltage waveforms (results of circuit simulation) over a period of 60 μs (micro second), where the output load is 1 kilo-ohm, 15 pF, and VDD=5V, VSS=0V and Vin=2.5V hold.

Figure 12:
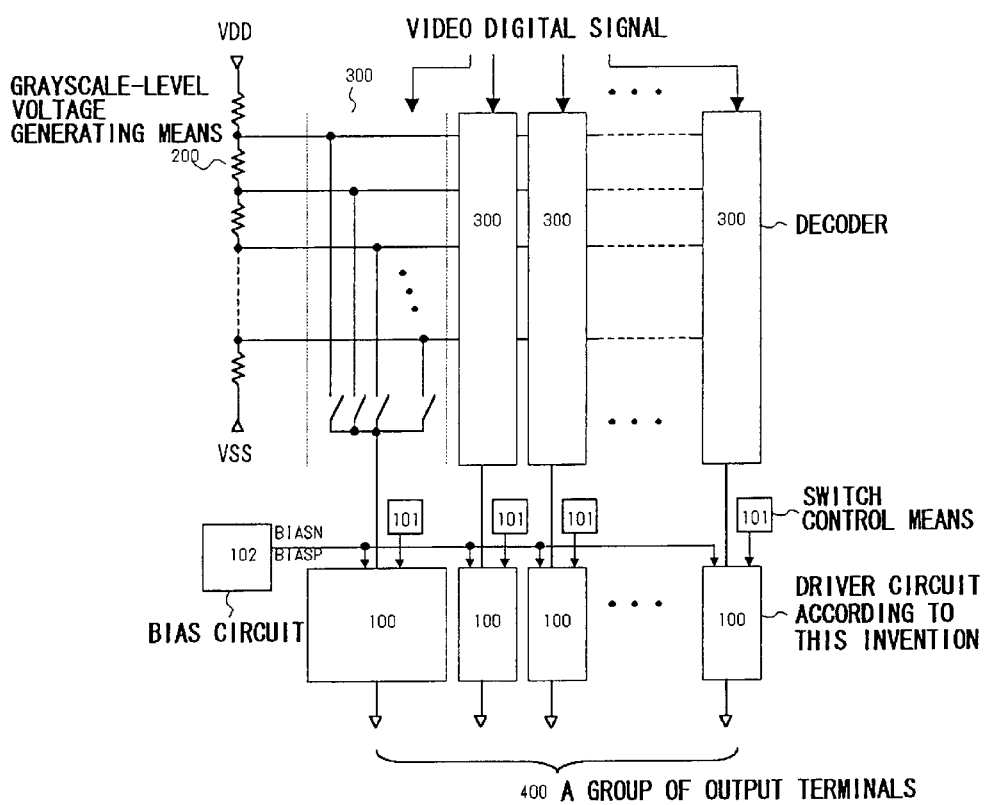
FIG. 12 is a diagram showing the structure of a multiple-output circuit having driver circuits according to the present invention.
Figure 13:
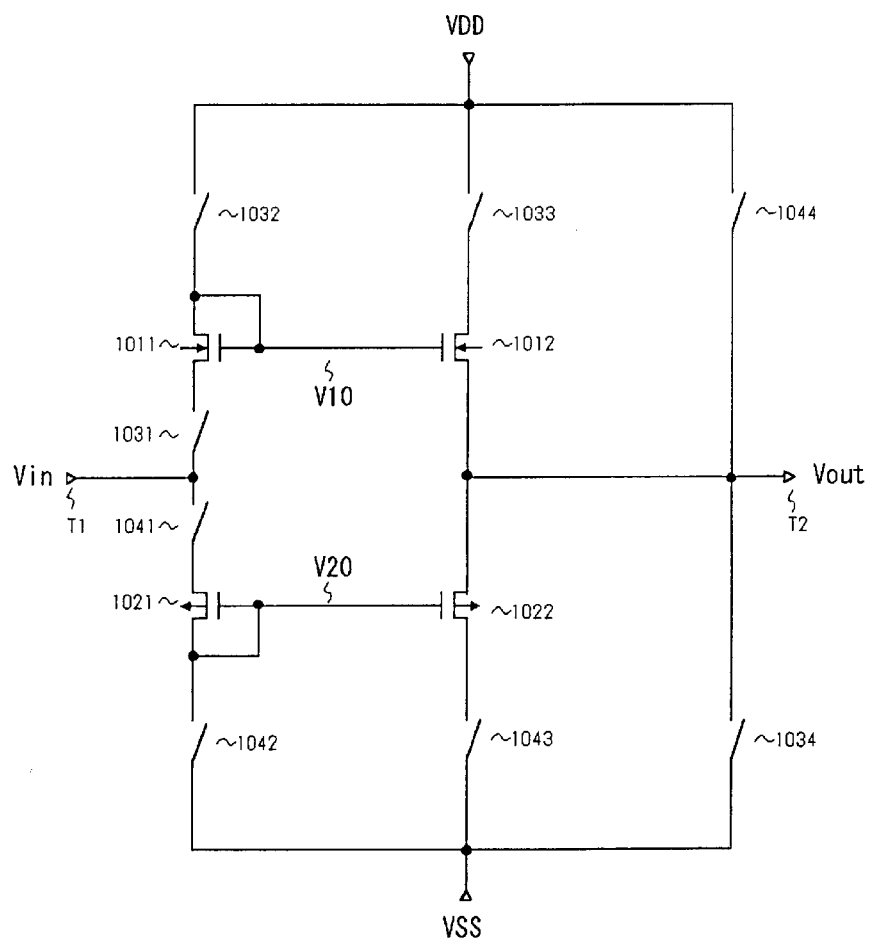
FIG. 13 is a diagram showing the structure of a driver circuit disclosed in the specification of Japanese Patent Kokai Publication JP-A-11-119750.
Figure 14A:
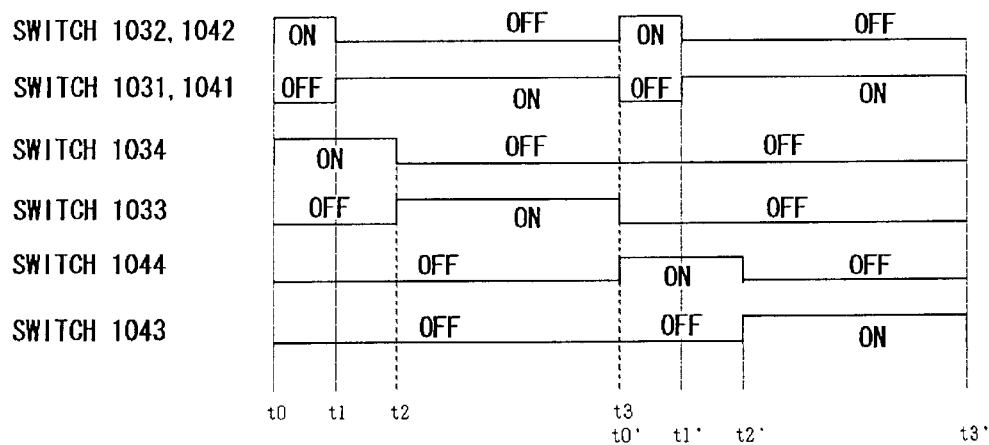
FIG. 14A is a timing chart useful in describing a switch control operation disclosed in the specification of Japanese Patent Kokai Publication JP-A-11-119750.
Figure 14B:
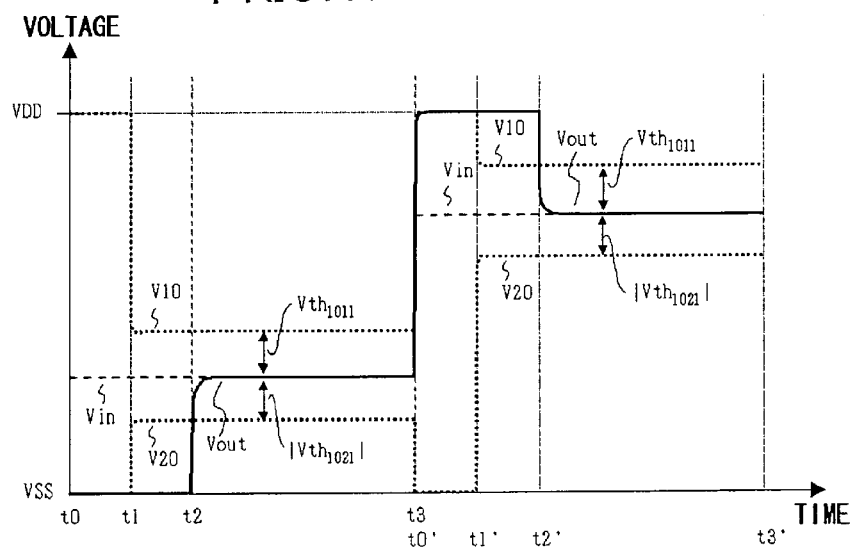
FIG. 14B is a waveform diagram illustrating voltage waveforms of an internal node, input signal voltage and output voltage.

FIG. 12 is a diagram showing an arrangement in which a driver circuit according to the present invention is applied to a multiple-output driver circuit. This multiple-output driver circuit is used to drive the data lines of a liquid crystal display device, by way of example. As shown in FIG. 12, the multiple-output driver circuit has grayscale-level voltage generating means 200, which is composed of a resistor string obtained by serially connecting a plurality of resistance elements between the high-potential power supply VDD and the low-potential power supply VSS serving as reference voltages, for outputting grayscale-level voltages from the taps of the resistor string. The grayscale-level voltages (analog voltages) from the grayscale-level voltage generating means 200 are input to a decoder 300, to which a video digital signal is also applied. The decoder 300 performs decoding on the basis of the video digital signal, selectively outputs a corresponding grayscale-level and inputs the voltage to a driver circuit 100. The driver circuit 100 comprises an arrangement according to any of the embodiments of FIGS. 6 to 9. A bias circuit 102 is constituted by the arrangement shown in FIG. 8 and outputs the bias voltages BIASN, BIASP.

The bias circuit 102 is provided for every predetermined M-number (M is a positive number) of driver circuits. Further, switch control means 101 is provided for turning the switches of the driver circuit 100 on and off. The switch control means 101 turns the switches of the driver circuit 100 on and off by a control operation of the kind shown in FIG. 2, FIG. 4, FIG. 9A or FIG. 10. A plurality of the driver circuits 100 are arrayed in parallel and have a group of output terminals 400 for driving the data lines of a liquid crystal panel. It should be noted that the parasitic capacitance at the output of the driver circuit shown in FIG. 1, etc., may be utilized in the charging and discharging of the output load as a matter of course.

In the embodiments set forth above, an example in which enhancement-type N-channel MOS transistors and P-channel MOS transistors are used is described. However, the description rendered above will hold true also with regard to depletion-type N-channel MOS transistors and P-channel MOS transistors.

Though the present invention has been described in accordance with the foregoing embodiments, the invention is not limited to these embodiments and it goes without saying that the invention covers various modifications and changes that would be obvious to those skilled in the art within the scope of the claims.

The meritorious effects of the present invention are summarized as follows.

Thus, as described above, the present invention is such that in a driver circuit whose output stage has a source-follower arrangement, source-follower drive of an output transistor is provided with an interval in which the drain current of the transistor is controlled and an interval in which the drain current is cut off. The source-follower operation is performed even in the cut-off interval, during which time output voltage can be driven to the vicinity of a desired voltage without static power being consumed. In the subsequent interval in which the drain current is controlled, drive up to the desired voltage can be performed at a high voltage precision. Thus, a reduction in power consumption and a highly precise voltage output can be achieved.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A driver circuit comprising:
    a follower transistor and a first switch connected serially between an output terminal and a first power supply;
    a first current source and a second switch connected serially between the output terminal and a second power supply; and
    a bias circuit for supplying the follower transistor with an input bias voltage based upon an input signal voltage,
    wherein said first switch is turned on at one timing in a data output interval, thereby causing said follower transistor to perform a follower operation to drive the output terminal voltage to the vicinity of a certain voltage approximately equal to the input signal voltage,
    said second switch is turned on at a timing subsequent to said one timing, thereby placing both said first and second switches in the ON state, and
    the output terminal voltage is driven to said certain voltage from said subsequent timing onward for a remainder of said data output interval.

2. The driver circuit according to claim 1, wherein, when the output terminal voltage becomes said input signal voltage, said bias circuit controls the voltage to a fixed bias voltage such that a current that flows through said follower transistor becomes minimal.

3. A driver circuit according to claim 1, further comprising:
    a switch controller to control an on/off operation of said switches.

4. The driver circuit of claim 1, wherein said switching sequence eliminates a static power consumption.

5. A driver circuit comprising:
    a source-follower first MOS transistor of a conductivity type and a first switch connected serially between an output terminal and a high-potential power supply;
    a first current source and a second switch connected serially between the output terminal and a low-potential power supply;
    a gate bias circuit for supplying said first MOS transistor with a gate bias voltage based upon an input signal voltage; and
    a switching controller for turning on said first switch at one timing in a data output interval, thereby causing said first MOS transistor to perform a source-follower operation to drive the output terminal voltage to the vicinity of a certain voltage approximately equal to the input signal voltage, and turning on said second switch at a timing subsequent to said one timing, thereby placing both said first and second switches in the ON state,
    wherein the output terminal voltage is driven to said certain voltage from said subsequent timing onward for a remainder of said data output interval.

6. The driver circuit according to claim 5, further comprising a pre-charging circuit for pre-discharging of the output terminal,
    wherein when low-potential data is to be output from the output terminal, the output terminal is pre-discharged prior to said one timing.

7. The driver circuit according to claim 5, wherein said gate bias circuit includes:
    a second MOS transistor of said conductivity type having a drain and gate connected in common with a gate of said first MOS transistor and a source connected to an input terminal via a third switch;
    a second current source and a fourth switch connected serially between the drain of said second MOS transistor and the high-potential power supply;
    a third current source and a fifth switch connected serially between a connection node of the input terminal and said third switch and the low-potential power supply; and
    a sixth switch connected between a common connection node of the gates of said first and second MOS transistors and the high-potential power supply.

8. The driver circuit of claim 5, wherein said switching sequence eliminates a static power consumption.

9. A driver circuit comprising:
    a source-follower first MOS transistor of a conductivity type and a first switch connected serially between an output terminal and a low-potential power supply;
    a current source and a second switch connected serially between the output terminal and a high-potential power supply;
    a gate bias circuit for supplying said first MOS transistor with a gate bias voltage based upon an input signal voltage; and
    a switching controller for turning on said first switch at one timing in a data output interval, thereby causing said first MOS transistor to perform a source-follower operation to drive the output terminal voltage to the vicinity of a certain voltage approximately equal to the input signal voltage, and turning on said second switch at a timing subsequent to said one timing, thereby placing both said first and second switches in the ON state, wherein the output terminal voltage is driven to said certain voltage from said subsequent timing onward for a remainder of said data output interval.

10. The driver circuit according to claim 9, further comprising:
   a precharging circuit for precharging the output terminal,
   wherein when high-potential data is to be output from the output terminal, the output terminal is precharged prior to said one timing.

11. The driver circuit according to claim 9, wherein said gate bias circuit includes:
   a second MOS transistor of said conductivity type having a drain and a gate connected in common with a gate of said first MOS transistor and a source connected to an input terminal via a third switch;
   a second current source and a fourth switch connected serially between the drain of said second MOS transistor and the low-potential power supply;
   a third current source and a fifth switch connected serially between a connection node of said input terminal and said third switch and the high-potential power supply; and
   a sixth switch connected between a common connection node of the gates of said first and second MOS transistors and the low-potential power supply.

12. The driver circuit of claim 9, wherein said switching sequence eliminates a static power consumption.

13. A driver circuit comprising:
   a source-follower first transistor of a first conductivity type and a first switch connected serially between an output terminal and a high-potential power supply;
   a first current source and a second switch connected serially between the output terminal and a low-potential power supply;
   a first gate bias circuit for supplying said first MOS transistor with a gate bias voltage based upon an input signal voltage;
   a source-follower second transistor of a second conductivity type and a third switch connected serially between an output terminal and a low-potential power supply;
   a second current source and a fourth switch connected serially between the output terminal and the high-potential power supply;
   a second gate bias circuit for supplying said second MOS transistor with a gate bias voltage based upon the input signal voltage;
   a first switch controller for turning on said first switch at one timing in a low-potential data output interval, thereby causing said first MOS transistor to perform a source-follower operation to drive the output terminal voltage to the vicinity of a certain voltage approximately equal to the input signal voltage, and turning on said second switch at a timing subsequent to said one timing, thereby placing both said first and second switches in the ON state, wherein the output terminal voltage is driven to said certain voltage from said subsequent timing onward for a remainder of said low-potential data output interval; and
   a second switch controller for turning on said third switch at one timing in a high-potential data output interval, thereby causing said second MOS transistor to perform a source-follower operation to drive the output terminal voltage to the vicinity of a certain voltage approximately equal to the input signal voltage, and turning on said fourth switch at a timing subsequent to said one timing of the high-potential data output interval, thereby placing both said third and fourth switches in the ON state, wherein the output terminal voltage is driven to said certain voltage from said subsequent timing onward for a remainder of said high-potential data output interval.

14. The driver circuit according to claim 13, further comprising:
   a pre-discharging/precharging circuit for pre-discharging and precharging the output terminal,
   wherein the output terminal is pre-discharged prior to said one timing in a data output interval in which the input signal voltage is low-potential data; and
   the output terminal is precharged prior to said one timing in a data output interval in which the input signal voltage is high-potential data.

15. A driver circuit of claim 13, further comprising:
   a grayscale-level generator having a plurality of resistors connected serially between first and second reference voltages, for generating grayscale-level voltages from taps thereof;
   a decoder circuit receiving a video digital signal and selectively outputting a corresponding voltage from said grayscale-level generator, said driver circuit receiving an output of said decoder circuit and driving a data line;
   a switch controller for controlling the switches in said driver circuits; and
   a bias circuit for supplying bias voltage to said current sources of said driver circuit.

16. A driver circuit according to claim 13, wherein said first gate bias circuit includes:
   a third MOS transistor of said first conductivity type having a drain and gate connected in common with a gate of said first MOS transistor and a source connected to an input terminal via a fifth switch;
   a third current source and a sixth switch connected serially between the drain of said third MOS transistor and the high-potential power supply;
   a fourth current source and an seventh switch connected serially between a connection node of the input terminal and said fifth switch and the low-potential power supply; and
   an eighth switch connected between a common connection node of the gates of said first and third MOS transistors and the high-potential power supply.

17. The driver circuit according to claim 13, wherein said second gate bias circuit includes:
   a third MOS transistor of said second conductivity type having a drain and gate connected in common with a gate of said second MOS transistor and a source connected to an input terminal via a fifth switch;
   a third current source and a sixth switch connected serially between the drain of said fourth MOS transistor and the low-potential power supply;
   a fourth current source and a seventh switch connected serially between a connection node of the input terminal and said fifth switch and the high-potential power supply; and
   an eighth switch connected between a common connection node of the gates of said second and fourth MOS transistors and the low-potential power supply.

18. The driver circuit of claim 13, wherein said switching sequence eliminates a static power consumption.

19. A driver circuit comprising:
- a source-follower first transistor of a first conductivity type and a first switch connected serially between an output terminal and a high-potential power supply;
- a first current source and a second switch connected serially between the output terminal and a low-potential power supply;
- a first gate bias circuit for supplying said first MOS transistor with a gate bias voltage based upon an input signal voltage;
- a source-follower second MOS transistor of a second conductivity type and a third switch connected serially between the output terminal and the low-potential power supply;
- a second current source and a fourth switch connected serially between the output terminal and the high-potential power supply;
- a second gate bias circuit for supplying said second MOS transistor with a gate bias voltage based upon the input signal voltage,
- wherein said first gate bias circuit includes:
  - a third MOS transistor of said first conductivity type having a drain and gate connected in common with a gate of said first MOS transistor and a source connected to an input terminal via a fifth switch;
  - a third current source and a sixth switch connected serially between the drain of said third MOS transistor and the high-potential power supply;
  - a fourth current source and an seventh switch connected serially between a connection node of the input terminal and said fifth switch and the low-potential power supply; and
  - an eighth switch connected between a common connection node of the gates of said first and third MOS transistors and the high-potential power supply, and
- said second gate bias circuit includes:
  - a fourth MOS transistor of said second conductivity type having a drain and gate connected in common with a gate of said second MOS transistor and a source connected to the input terminal via a ninth switch;
  - a fifth current source and a tenth switch connected serially between the drain of said fourth MOS transistor and the low-potential power supply;
  - a sixth current source and an 11th switch connected serially between a connection node of the input terminal and said ninth switch and the high-potential power supply; and
  - a 12th switch connected between a common connection node of the gates of said second and fourth MOS transistors and the low-potential power supply;
- a first switch controller for turning on said first switch at one timing in a low-potential data output interval, thereby causing said first MOS transistor to perform a source-follower operation to drive the output terminal voltage to the vicinity of a certain voltage approximately equal to said input signal voltage, and turning on said second switch at a timing subsequent to said one timing, thereby placing both said first and second switches in the ON state, wherein the output terminal voltage is driven to said certain voltage from said subsequent timing onward for a remainder of said low-potential data output interval; and
- a second switch controller for turning on said third switch at one timing in a high-potential data output interval, thereby causing said second MOS transistor to perform a source-follower operation to drive the output terminal voltage to the vicinity of a certain voltage approximately equal to the input signal voltage, and turning on said fourth switch at a timing subsequent to said one timing, thereby placing both said third and fourth switches in the ON state, wherein the output terminal voltage is driven to said certain voltage from said subsequent timing onward for a remainder of said high-potential data output interval.

20. The driver circuit according to claim 19, further comprising:
- a precharging circuit including a 13th switch connected between the high-potential power supply and the output terminal; and
- a pre-discharging circuit including a 14th switch connected between the low-potential power supply and the output terminal,
- wherein the output terminal is pre-discharged by turning on said 14th switch prior to said one timing in the low-potential data output interval in which the input signal voltage is low-potential data, and
- the output terminal is precharged by turning on said 13th switch prior to said one timing in the high-potential data output interval in which the input signal voltage is high-potential data.

21. The driver circuit according to claim 19, wherein:
- a data output interval in which the input signal voltage is low-potential data comprises four timing intervals which are first to fourth timing intervals;
- said eighth switch is turned on and the remaining first to seventh and ninth to 12th switches are off in the first timing interval;
- said eighth switch is turned off and said fifth switch is turned on in the second timing interval;
- the output terminal is pre-discharged in at least one of the first and second timing intervals;
- said first switch is turned on and said fifth switch is on in the third timing interval;
- said second switch is turned on, said first and fifth switches are on, and said sixth and seventh switches are turned on in the fourth timing interval;
- a data output interval in which the input signal voltage is high-potential data comprises four timing intervals which are first to fourth timing intervals;
- said 12th switch is turned on and the first to 11th switches are off in the first timing interval;
- said 12th switch is turned off and said ninth switch is turned on in the second timing interval;
- the output terminal is precharged in at least one of the first and second timing intervals;
- said third switch is turned on and said ninth switch is on in the third timing interval; and
- said fourth switch is turned on, said third and ninth switches are on, and said tenth and 11th switches are turned on in the fourth timing interval.

22. The driver circuit according to claim 19, wherein said first, fourth, and fifth current sources each comprise a transistor of said first conductivity type, and said second third, and sixth current sources each comprise a transistor of said second conductivity type, said driver circuit further comprising:

a bias circuit for applying a first bias voltage to gates of transistors of said second conductivity type constructing said second, third and sixth current sources, and for applying a second bias voltage to gates of transistors of said first conductivity type constructing said first, fourth and fifth current sources, wherein said bias circuit has a switch in a power supply path of the first and second bias voltages and is actuated and de-actuated under control by said switch.

23. The driver circuit according to claim 21, wherein said first, fourth, and fifth current sources each comprise a transistor of said first conductivity type, and said second third, and sixth current sources each comprise a transistor of said second conductivity type, said driver circuit further comprising:

a bias circuit for applying a first bias voltage to gates of transistors of second conductivity type constructing said second, third and sixth current sources, and for applying a second bias voltage to gates of transistors of first conductivity type constructing said first, fourth and fifth current sources, wherein said bias circuit has a switch in a power supply path of the first and second bias voltages, and said switch is turned on at least in the fourth timing interval.

24. A driver circuit comprising:

a source-follower first transistor of a first conductivity type and a first switch connected serially between an output terminal and a high-potential power supply;

a first current source and a second switch connected serially between the output terminal and a low-potential power supply;

a first gate bias circuit for supplying said first MOS transistor with a gate bias voltage based upon an input signal voltage;

a source-follower second MOS transistor of a second conductivity type and a third switch connected serially between the output terminal and the low-potential power supply;

a second current source and a fourth switch connected serially between the output terminal and the high-potential power supply;

a second gate bias circuit for supplying said second MOS transistor with a gate bias voltage based upon the input signal voltage, wherein said first gate bias circuit includes:

a third MOS transistor of said first conductivity type having a drain and gate connected in common with a gate of said first MOS transistor and a source connected to an input terminal via a fifth switch;

a third current source and a sixth switch connected serially between the drain of said third MOS transistor and the high-potential power supply;

a fourth MOS transistor of said second conductivity type having a source and a drain connected to the drain and source, respectively, of said third MOS transistor; and a seventh switch connected between a common connection node of the gates of said first and third MOS transistors and the high-potential power supply; and said second gate bias circuit includes:

a fifth MOS transistor of said second conductivity type having a drain and gate connected in common with a gate of said second MOS transistor and a source connected to the input terminal via an eighth switch;

a fourth current source and a ninth switch connected serially between the drain of said fifth MOS transistor and the low-potential power supply;

a sixth MOS transistor of said first conductivity type having a source and a drain connected to the drain and source, respectively, of said fifth MOS transistor; and a tenth switch connected between a common connection node of the gates of said second and fifth MOS transistors and the low-potential power supply;

a first switch controller for turning on said first switch at one timing in a low-potential data output interval, thereby causing said first MOS transistor to perform a source-follower operation to drive the output terminal voltage to the vicinity of a certain voltage approximately equal to the input signal voltage, and turning on said second switch at a timing subsequent to said one timing, thereby placing both said first and second switches in the ON state, wherein the output terminal voltage is driven to said certain voltage from said subsequent timing onward for a remainder of said low-potential data output interval; and a second switch controller for turning on said third switch at one timing in a high-potential data output interval, thereby causing said second MOS transistor to perform a source-follower operation to drive the output terminal voltage to the vicinity of a certain voltage approximately equal to the input signal voltage, and turning on said fourth switch at a timing subsequent to said one timing, thereby placing both said third and fourth switches in the ON state, wherein the output terminal voltage is driven to said certain voltage from said subsequent timing onward for a remainder of said high-potential data output interval.

25. The driver circuit according to claim 24, further comprising:

a precharging circuit including an 11th switch connected between the high-potential power supply and the output terminal; and a pre-discharging circuit including a 12th switch connected between the low-potential power supply and the output terminal, wherein the output terminal is pre-discharged by turning on said 12th switch prior to said one timing in the low-potential data output interval in which the input signal voltage is low-potential data, and the output terminal is precharged by turning on said 11th switch prior to said one timing in the high-potential data output interval in which the input signal voltage is high-potential data.

26. The driver circuit according to claim 24, wherein:

a data output interval in which the input signal voltage is low-potential data comprises four timing intervals which are first to fourth timing intervals;

at least the seventh switch of said seventh and tenth switches is turned on and the remaining first to sixth and eighth and ninth switches are off in the first timing interval;

said seventh and tenth switches are off and at least the fifth switch of said fifth and eighth switches is turned on in the second timing interval;

the output terminal is pre-discharged in at least one of the first and second timing intervals;

said first switch is turned on and at least the fifth switch of said fifth and eighth switches is on in the third timing interval;

said second switch is turned on, said first switch is on, at least the fifth switch of said fifth and eighth switches is on and at least the sixth switch of said sixth and ninth switches is turned on in the fourth timing interval;

a data output interval in which the input signal voltage is high-potential data comprises four timing intervals which are first to fourth timing intervals;

at least the tenth switch of said seventh and tenth switches is turned on and the remaining first to sixth and eighth and ninth switches are off in the first timing interval;

said seventh and tenth switches are off and at least the eighth switch of said fifth and eighth switches is turned on in the second timing interval;

the output terminal is precharged in at least one of the first and second timing intervals;

said third switch is turned on and at least the eighth switch of said fifth and eighth switches is on in the third timing interval; and said fourth switch is turned on, said third switch is on, at least the eighth switch of said fifth and eighth switches is on and at least the ninth switch of said sixth and ninth switches is turned on in the fourth timing interval.

27. The drive circuit according to claim 26, wherein said first, fourth, and fifth current sources each comprise a transistor of said first conductivity type, and said second third, and sixth current sources each comprise a transistor of said second conductivity type, said driver circuit further comprising:

a bias circuit for applying a first bias voltage to gates of transistors of said second conductivity type constructing said second, third and sixth current sources, and for applying a second bias voltage to gates of transistors of said first conductivity type constructing said first, fourth and fifth current sources, wherein said bias circuit has a switch in a power supply path of the first and second bias voltages, and said switch is turned on at least in the fourth timing interval.

28. The driver circuit according to claim 24, wherein said first, fourth, and fifth current sources each comprise a transistor of said first conductivity type, and said second third, and sixth current sources each comprise a transistor of said second conductivity type, said driver circuit further comprising:

a bias circuit for applying a first bias voltage to gates of transistors of said second conductivity type constructing said second, third and sixth current sources, and for applying a second bias voltage to gates of transistors of said first conductivity type constructing said first, fourth and fifth current sources, wherein said bias circuit has a switch in a power supply path of the first and second bias voltages and is actuated and deactivated under control by said switch.

29. The driver circuit of claim 24, wherein said switching sequence eliminates a static power consumption.

30. A driver circuit comprising:

a source-follower transistor of a first conductivity type and a first switch connected serially between a high-potential power supply and an output terminal;

a source-follower transistor of a second conductivity type and a second switch connected serially between the output terminal and a low-potential power supply;

a first current source and a third switch connected serially between the high-potential power supply and the output terminal;

a second current source and a fourth switch connected serially between the low-potential power supply and the output terminal;

a first gate bias circuit, to which an input signal voltage is applied, for controlling bias voltage of the gate of said transistor of the first conductivity type;

a second gate bias circuit, to which the input signal voltage is applied, for controlling bias voltage of the gate of said transistor of the second conductivity type; and a preliminary charging/discharging circuit for precharging or pre-discharging the output terminal in accordance with the input signal voltage, wherein, in one output interval in which a low potential level below a predetermined reference voltage is to be output, the output terminal is pre-discharged and said first to fourth switches are all turned off at a first time, pre-discharging is halted and said first switch is turned on at a second time, and said first switch is left in the on state and said fourth switch is turned on at a third time, and in one output interval in which a high potential level equal to or greater than the predetermined reference voltage is to be output, the output terminal is precharged and said first to fourth switches are all turned off at a first time, precharging is halted and said second switch is turned on at a second time, and said second switch is left in the on state and said fourth switch is turned on at a third time.

31. The driver circuit of claim 30, wherein said switching sequence eliminates a static power consumption.

32. A liquid crystal display device, comprising:

a plurality of driver circuits each said driver circuit comprising:

a follower transistor and a first switch connected serially between an output terminal and a first power supply;

a first current source and a second switch connected serially between the output terminal and a second power supply; and a bias controller for supplying the follower transistor with an input bias voltage based upon an input signal voltage;

wherein said first switch is turned on at one timing in a data output interval, thereby causing said follower transistor to perform a follower operation to drive the output terminal voltage to the vicinity of a certain voltage approximately equal to the input signal voltage;

said second switch is turned on at a timing subsequent to said one timing, thereby placing both said first and second switches in the ON state; and the output terminal voltage is driven to said certain voltage from said subsequent timing onward for a remainder of said data output interval.

33. A drive circuit comprising:

a follower transistor arranged between an output terminal and a first power supply;

a first control means for controlling activation and deactivation of the transistor;

a current source arranged between the output terminal and a second power supply;

a second control means for controlling activation and deactivation of the current source;

a bias control means for supplying the transistor with an input bias voltage based upon an input signal voltage;

wherein control is made such that said follower transistor is activated while said current source is deactivated at one timing in a data output interval, thereby causing said follower transistor to perform a follower operation, and then from a timing subsequent to said one timing onward, both said transistor and said current source are activated to cause the output terminal voltage to be driven to a certain voltage approximately equal to the input signal voltage.

34. The driver circuit of claim 33, wherein said switching sequence eliminates a static power consumption.

* * * * *